United States Patent
Yoshihara et al.

(10) Patent No.: US 8,610,246 B2
(45) Date of Patent: Dec. 17, 2013

(54) SEMICONDUCTOR DEVICE CAPABLE OF RESTRICTING COIL EXTENSION DIRECTION AND MANUFACTURING METHOD THEREOF

(75) Inventors: Shinji Yoshihara, Nagoya (JP); Kazushi Asami, Okazaki (JP); Yasuhiro Kitamura, Chiryu (JP); Junji Oohara, Nisshin (JP)

(73) Assignee: DENSO CORPORATION, Kariya (JP)

( * ) Notice: Subject to any disclaimer, the term of this patent is extended or adjusted under 35 U.S.C. 154(b) by 163 days.

(21) Appl. No.: 13/084,074

(22) Filed: Apr. 11, 2011

(65) Prior Publication Data
US 2011/0248380 A1    Oct. 13, 2011

(30) Foreign Application Priority Data

Apr. 13, 2010  (JP) .................................... 2010-92304
Feb. 3, 2011   (JP) .................................... 2011-21759

(51) Int. Cl.
*H01L 29/00*  (2006.01)

(52) U.S. Cl.
USPC ........................................................ 257/531

(58) Field of Classification Search
USPC .......................................... 257/531, 534, 774
See application file for complete search history.

(56) References Cited

U.S. PATENT DOCUMENTS

| | | | |
|---|---|---|---|
| 4,763,403 A | | 8/1988 | Klein et al. |
| 5,532,667 A | * | 7/1996 | Haertling et al. ............... 336/177 |
| 5,936,298 A | * | 8/1999 | Capocelli et al. ............. 257/531 |
| 7,564,319 B2 | * | 7/2009 | Ding et al. .................... 331/181 |
| 7,750,408 B2 | * | 7/2010 | He et al. ........................ 257/355 |
| 7,859,085 B2 | * | 12/2010 | Pagaila et al. ................ 257/621 |
| 8,227,892 B2 | * | 7/2012 | Chang ........................... 257/531 |
| 2003/0127704 A1 | * | 7/2003 | Kobayashi et al. ........... 257/531 |
| 2004/0077124 A1 | * | 4/2004 | Ogawa .......................... 438/106 |
| 2004/0229454 A1 | * | 11/2004 | Torres et al. .................. 438/622 |
| 2004/0238929 A1 | | 12/2004 | Anzai et al. |
| 2005/0003199 A1 | * | 1/2005 | Takaya et al. ................. 428/413 |
| 2005/0093668 A1 | * | 5/2005 | Bueyuektas et al. .......... 336/200 |
| 2007/0121305 A1 | * | 5/2007 | Iijima et al. .................... 361/760 |

FOREIGN PATENT DOCUMENTS

| | | |
|---|---|---|
| JP | A-02-121310 | 5/1990 |
| JP | A-2004-186638 | 7/2004 |
| JP | A-2006-186037 | 7/2006 |
| KR | 20070027926 A | 3/2007 |

OTHER PUBLICATIONS

CN Office Action dated Feb. 25, 2013 in corresponding CN Application No. 2011100943670 (with English translation).

* cited by examiner

*Primary Examiner* — Nathan Ha
(74) *Attorney, Agent, or Firm* — Posz Law Group, PLC

(57) ABSTRACT

In a manufacturing method for a semiconductor device having a coil layer part on a substrate, two support substrates each having a flat surface are prepared, and a component member is formed on the flat surface of each of the support substrates. The component member includes a wiring portion having a predetermined pattern and an insulation film surrounding the wiring portion. The wiring portion is provided with a connecting portion exposing from the insulation film. A coil layer part is formed by opposing and bonding the component members formed on the support substrates to each other while applying pressure in a condition where the flat surfaces of the support substrates are parallel to each other. A coil is formed in the coil layer part by connecting the wiring portions through the connecting portions.

4 Claims, 15 Drawing Sheets

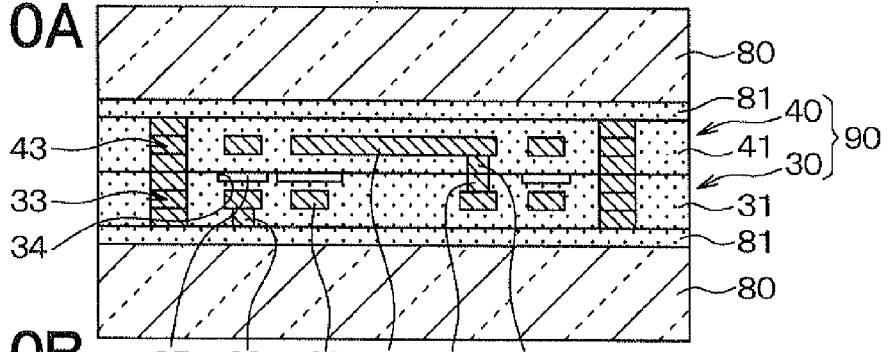
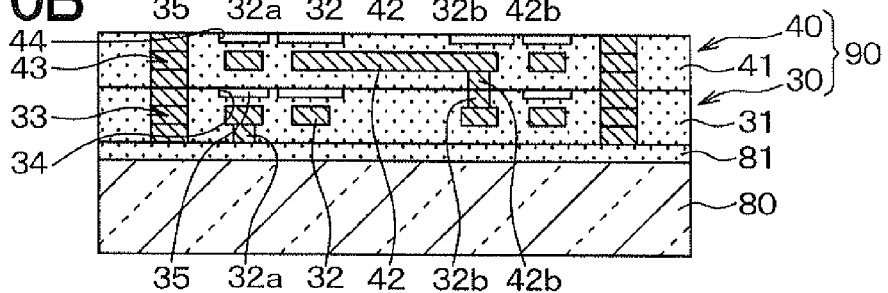
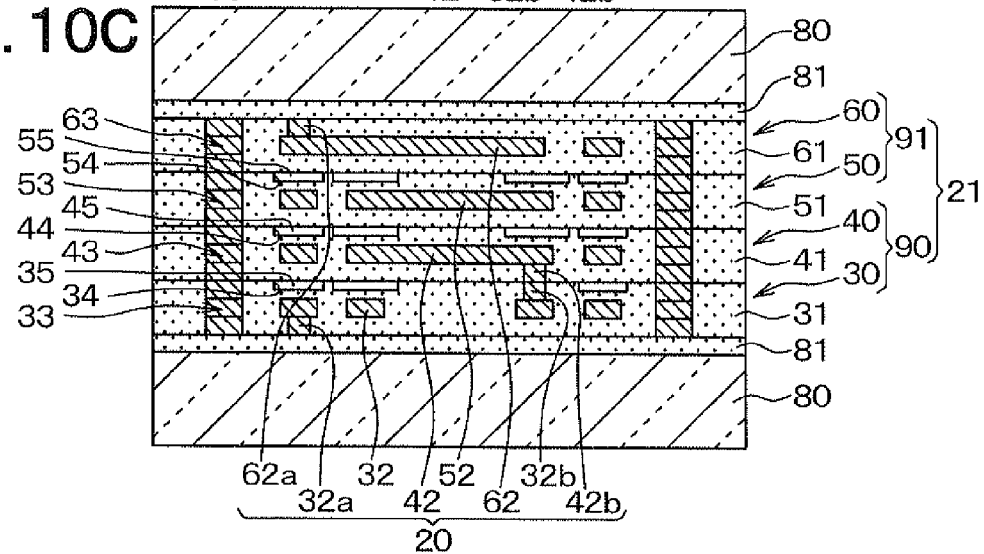
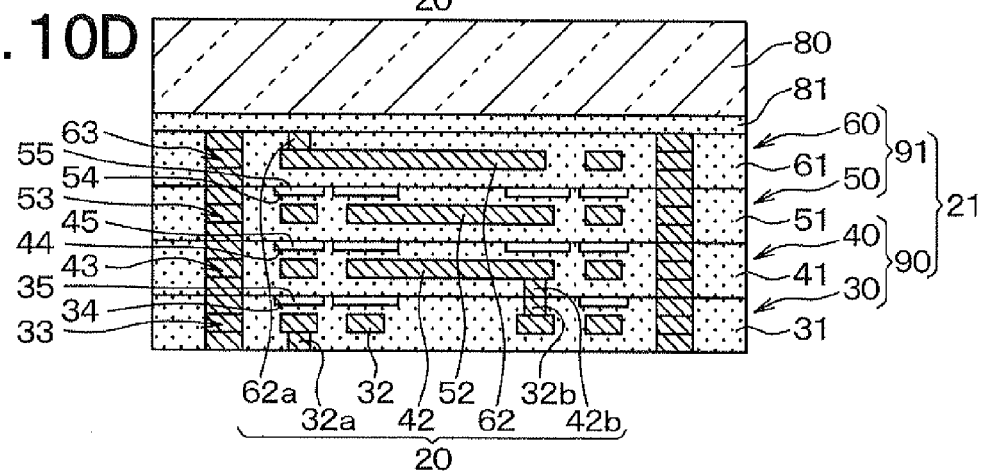

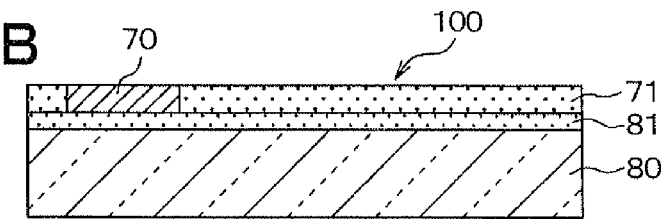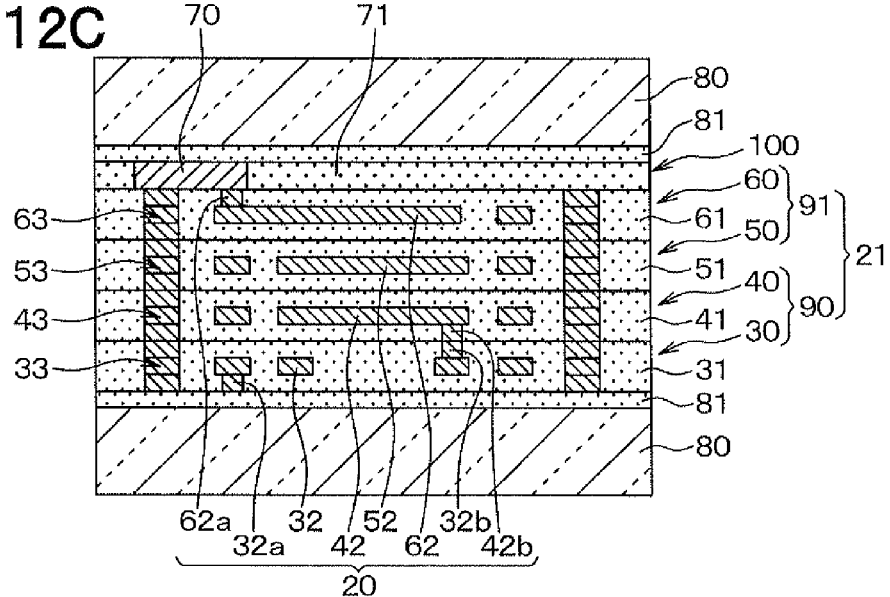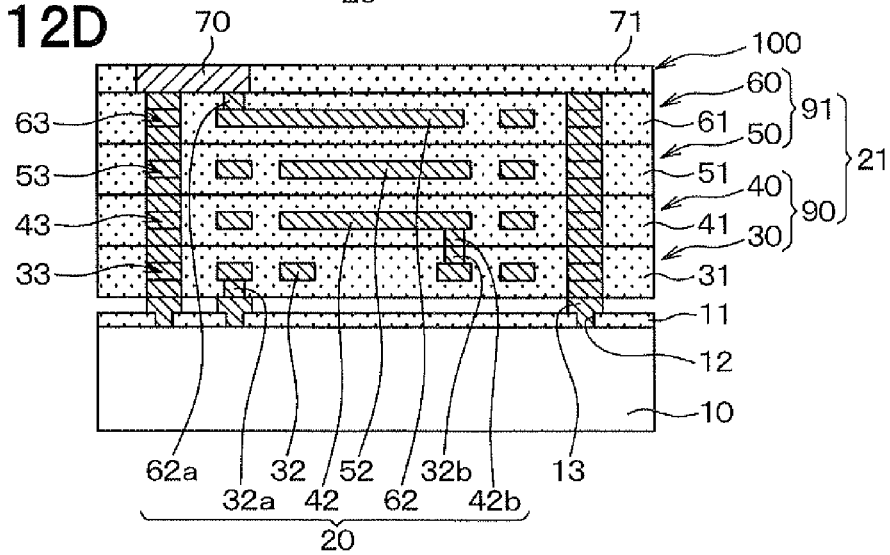

SEMICONDUCTOR DEVICE CAPABLE OF RESTRICTING COIL EXTENSION DIRECTION AND MANUFACTURING METHOD THEREOF

CROSS REFERENCE TO RELATED APPLICATION

This application is based on Japanese Patent Applications No. 2010-92304 filed on Apr. 13, 2010 and No. 2011-21759 filed on Feb. 3, 2011, the disclosure of which are incorporated herein by reference.

FIELD OF THE INVENTION

The present invention relates to a semiconductor device having a coil layer part, which accommodates a coil therein, on a board, and a method of manufacturing a semiconductor device.

BACKGROUND OF THE INVENTION

A semiconductor device having a coil, which is disposed on a surface of a board and extends in a direction of normal to the surface, has been known. Such a semiconductor device is, for example, described in Japanese Patent Application Publication No. 2004-356119, which corresponds to US2004/0238929.

Such a semiconductor device is, for example, manufactured in a following manner. First, an insulation film or the like is formed on a semiconductor substrate by a spin coating technique or the like, and a frame-shaped first wiring portion is formed on the insulation film by a sputtering technique or the like. Next, a first connecting portion is formed at an end of the first wiring portion by a photolithography process and plating or the like. Then, an insulation film is deposited to surround side surfaces of the first connecting portion, by a spin coating technique or the like. Further, a second wiring portion is formed on the insulation film by a sputtering technique or the like. The second wiring portion has a frame shape, and an end of the second wiring portion is connected to the first connecting portion.

Thereafter, the step of forming the connecting portion at the end of the wiring portion, the step of placing the insulation film to surround the side surfaces of the connecting portion and the step of forming another wiring portion to be connected to the connecting portion on the insulation film are successively performed. In this way, the coil constructed of the wiring portions connected through the connecting portions is formed on the semiconductor substrate.

In such a manufacturing method, however, if the insulation film is deposited by the spin coating technique or the like, the surface of the insulation film will not be flat. Therefore, in a semiconductor device constructed by layering multiple component members each made of the wiring portion, the connecting portion and the insulation film surrounding the side surfaces of the connecting portion, an extension direction of the coil will be inclined relative to a layering direction of the component members, which is parallel to a direction of normal to the semiconductor substrate. As a result, it is difficult to obtain desirable inductance relative to the number of the wiring portions.

It is considered to flatten the surface of the insulation film by polishing or the like every after the insulation film is deposited around the connecting portion and then form the wiring portion on the flattened insulation film, so as to restrict the extension direction of the coil from inclining relative to the layering direction of the component members. In such a method, however, the number of manufacturing steps increases due to the flattening of the surface of each insulation film.

SUMMARY OF THE INVENTION

The present invention is made in view of the foregoing matter, and it is an object of the present invention to provide a method of manufacturing a semiconductor device, capable of restricting an extension direction of a coil from inclining relative to a layering direction of component members without flattening an insulating film of every component member. It is another object of the present invention to provide a semiconductor device capable of restricting an extension direction of a coil from inclining relative to a layering direction of component members.

In a manufacturing method for a semiconductor device according to an aspect, two support substrates each having a flat surface are prepared, and a component member is formed on the flat surface of each of the support substrates. The component member includes a wiring portion having a predetermined pattern and an insulation film surrounding the wiring portion. The wiring portion is provided with a connecting portion exposing from the insulation film. The component members formed on the support substrates are opposed to each other, and bonded to each other while applying pressure in a condition where the flat surfaces of the support substrates are parallel to each other such that the wiring portions are connected to each other through the connecting portions, thereby forming a coil layer part having the support substrate on opposite ends of layered component members and including a coil therein.

In such a manufacturing method, the coil layer part is formed by opposing the component members formed on the support substrates and bonding the opposed component members while applying pressure. Further, the coil is formed in the coil layer part by connecting the wiring portions through the connecting portion while holding the support substrates such that the flat surfaces of the support substrates are parallel to each other. Therefore, even if bonding surfaces of the component members are rough surfaces, since the wiring portions are connected while applying pressure in a condition where the flat surfaces of the support substrates are parallel to each other, it is less likely that an extension direction of the coil will be inclined relative to a layering direction of the component members. As such, it is not necessary to flatten the surface of each component member by polishing or the like after the component member is formed on the support substrate.

In a semiconductor device according to an aspect, a coil layer part is disposed on a surface of a board. The coil layer part is constructed of a plurality of component members. The coil layer part includes a coil defining an axis in a direction of a normal to the surface of the board. Each of the component members includes a wiring portion having a predetermined pattern and an insulation film surrounding the wiring portion. The wiring portion is provided with a connecting portion exposing from the insulation film. The coil is constructed of the wiring portions connected to each other through the connecting portions. The coil layer part is formed by bonding the component members disposed on surfaces of support substrates while maintaining the flat surfaces of the support substrates parallel to each other. The coil layer part has an accommodation space between adjacent component members. The accommodation space is provided by a recess, which is formed on a surface of at least one of the adjacent component members.

In such a semiconductor device, the component members are bonded while maintaining the support substrates such that the flat surfaces thereof are parallel to each other. Therefore, it is less likely that an extension direction of the coil, that is, the axis of the coil will be inclined relative to a layering direction of the component member.

Further, since the accommodation space is provided between the adjacent component members, it is less likely that air bubbles will remain in an area other than the accommodation space between the adjacent component members.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIGS. 9A through 9F and 10A through 10D are cross-sectional views for showing a manufacturing process of the semiconductor device shown in FIG. 7;

FIGS. 12A through 12D are cross-sectional views for showing a manufacturing process of a semiconductor device according to a fourth embodiment of the present invention;

DETAILED DESCRIPTION OF EXEMPLARY EMBODIMENTS (First Embodiment)

Figure 1:
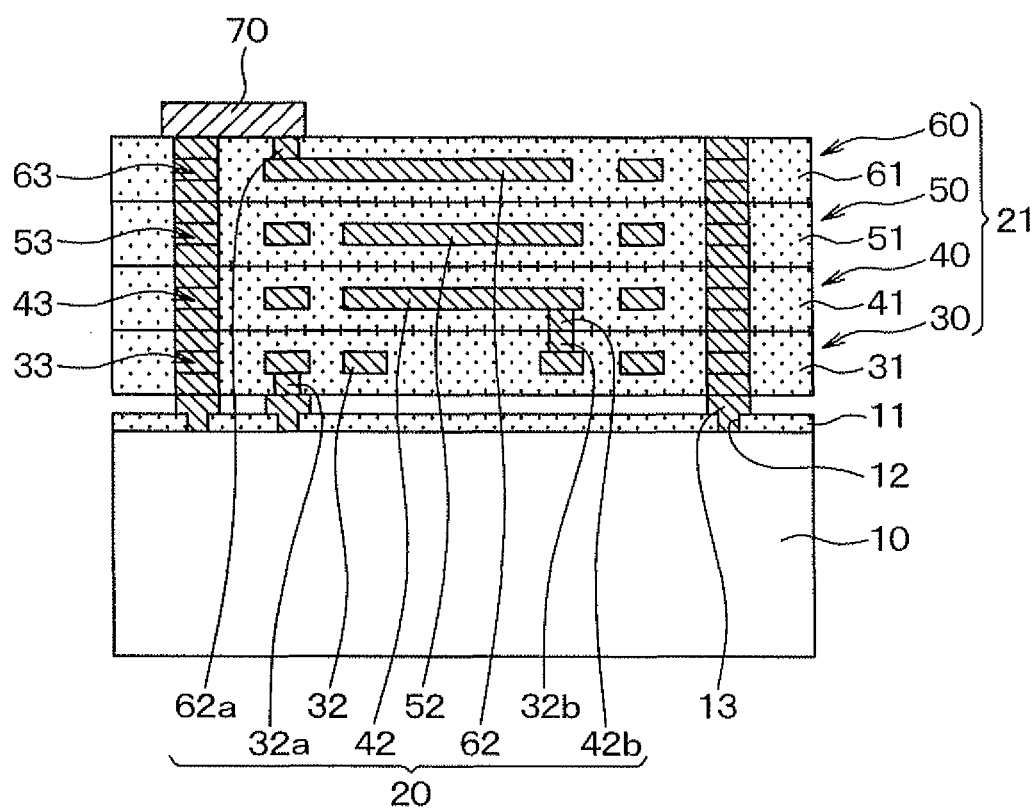
FIG. 1 is a cross-sectional view of a semiconductor device manufactured by a manufacturing method according to a first embodiment of the present invention.

A first embodiment will be described hereinafter with reference to FIGS. 1 through 6D. FIG. 1 is a cross-sectional view of a semiconductor device manufactured by a manufacturing method according to the first embodiment.

Referring to FIG. 1, the semiconductor device generally has a board such as a circuit board 10 and a coil layer part 21 disposed on the circuit board 10. The coil layer part 21 includes a coil 20 therein.

The circuit board 10, for example, has a rectangular plate shape. An insulation film 11 is disposed on a surface of the circuit board 10. The insulation film 11 is formed with openings 12. Metal films 13 are disposed in the openings 12. For example, the metal films 13 are made of copper (Cu), gold (Au), aluminum (Al) or the like. The metal films 13 are electrically connected to a wiring (not shown) formed on the circuit board 10.

The coil layer part 21 is disposed on the surface of the circuit board 10. The coil 20 is wound in the direction of the normal to the surface of the circuit board 10. That is, the coil 20 is wound around an axis that is parallel to the direction of the normal to the surface of the circuit board 10. In the present embodiment, the axis of the coil 20 corresponds to an extension direction of the coil 20.

The coil layer part 21 is constructed of a stack of component members. For example, the coil layer part 21 is constructed of a first component member 30, a second component member 40, a third component member 50, and a fourth component member 60, which are layered on top of one another. Hereinafter, structures of the first through fourth component members 30, 40, 50, 60 will be described.

Figure 2C:
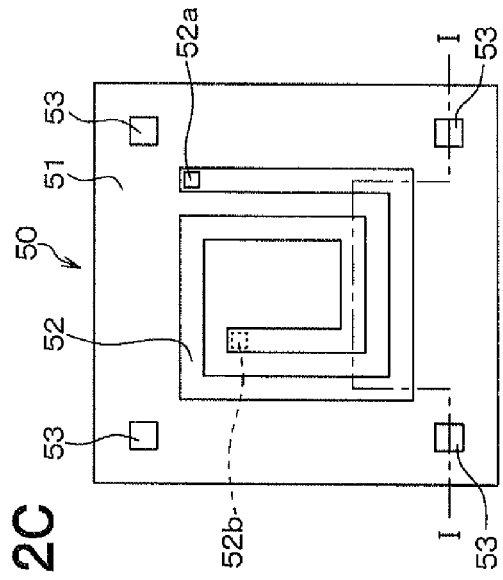
FIGS. 2A through 2D are schematic plan views of first through fourth component members of a coil layer part of the semiconductor device shown in FIG. 1.
Figure 2D:
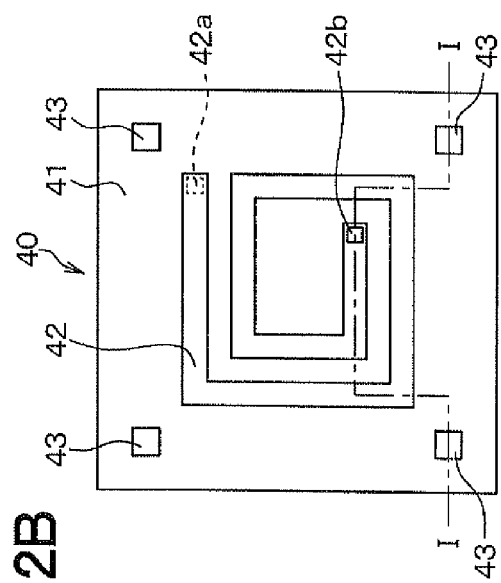
Figure 2A:
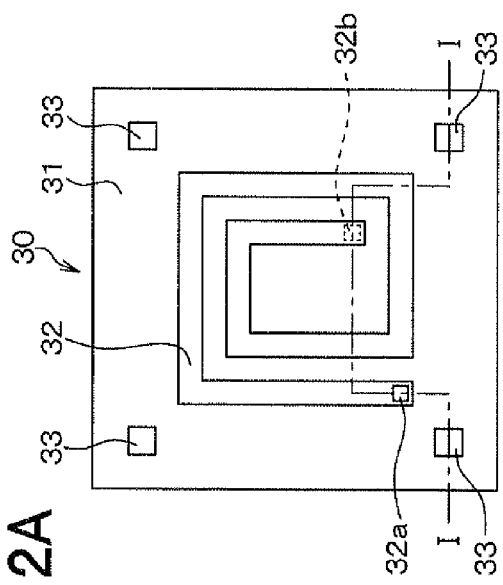
Figure 2B:
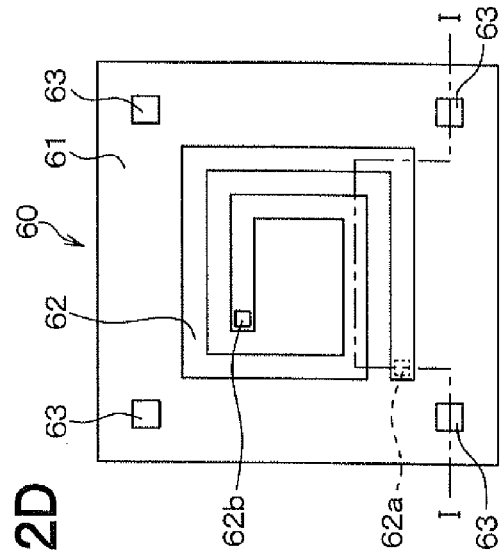

FIG. 2A is a schematic plan view of the first component member 30. FIG. 2B is a schematic plan view of the second component member 40. FIG. 2C is a schematic plan view of the third component member 40. FIG. 2D is a schematic plan view of the fourth component member 40. FIGS. 2A through 2D are plan views when viewed from the circuit board 10, that is, from a bottom of FIG. 1. The cross-sectional view of the coil layer part 21 of FIG. 1 corresponds to a view taken along lines 1-1 in FIGS. 2A through 2D.

As shown in FIGS. 1 and 2A, the first component member 30 generally has a rectangular plate shape. The first component member 30 includes a low-permittivity film 31 that forms an outline of the first component member 30. The size of the first component member 30 is the same as the size of the circuit board 10, with respect to a plane parallel to the surface of the circuit board 10.

The first component member 30 further includes a wiring portion 32 in the low-permittivity film 31. The wiring portion 32 has a predetermined pattern. For example, the wiring portion 32 is wound in a spiral form from an inner position toward an outer position of the first component member 30. For example, a center of the spiral form coincides with a center of the first component member 30.

The wiring portion 32 is provided with a first connecting portion 32a and a second connecting portion 32b. The first connecting portion 32a is located at an outer end of the wiring portion 32 and exposed from a first surface of the low-permittivity film 31 facing the circuit board 10. The second connecting portion 32b is located at an inner end of the wiring portion 32 and exposed from a second surface of the low-permittivity film 31 facing the second component member 40. The outer end is an end of the wiring portion 32 located further from the center of the first component member 30 than the inner end of the wiring portion 32 that is closer to the center of the first component member 30. The low-permittivity film 31 serves as an insulation film. The low-permittivity film 31 is, for example, made of a polyimide base resin.

The first component member 30 further includes conductive parts 33 on a periphery of an area in which the wiring portion 32 is disposed. For example, the first component member 30 has four conductive parts 33. Each of the four conductive parts 33 is spaced from the center of the first component member 30 by a predetermined distance. Further, the four conductive parts 33 are point symmetrical with respect to the center of the first component member 30.

The second through fourth component members 40, 50, 60 have similar structures to the first component member 30. As shown in FIG. 2B, the second component member 40 has a rectangular plate shape having the same size as the circuit board 10, with respect to a plane along the surface of the circuit board 10. The second component member 40 includes a low-permittivity film 41 forming an outline of the second component member 40.

The second component member 40 further includes a wiring portion 42 in the low-permittivity film 41. The wiring portion 42 is arranged in the similar pattern to the wiring portion 32 of the first component member 30. The wiring portion 42 has the predetermined pattern. The wiring portion 42 is wound in a spiral form from an inner position toward an outer position of the second component member 40. For example, a center of the spiral form coincides with a center of the second component member 40.

As shown in FIG. 2C, the third component member 50 includes a low-permittivity film 51 forming an outline of the third component member 50. The third component member 50 has a rectangular plate shape having the same size as the circuit board 10, with respect to a plane along the surface of the circuit board 10.

The third component member 50 further includes a wiring portion 52 in the low-permittivity film 51. The wiring portion 52 is arranged in the similar pattern to the wiring portion 32 of the first component member 30. The wiring portion 52 has the predetermined pattern. For example, the wiring portion 52 is wound in a spiral form from an inner position toward an outer position of the third component member 50. For example, a center of the spiral form coincides with a center of the third component member 50.

As shown in FIG. 2D, the fourth component member 60 includes a low-permittivity film 61 forming an outline of the fourth component member 60. The fourth component member 60 has a rectangular plate shape having the same size as the circuit board 10 with respect to a plane along the surface of the circuit board 10.

The fourth component member 60 further includes a wiring portion 62 in the low-permittivity film 61. The wiring portion 62 is arranged in the similar pattern to the wiring portion 32 of the first component member 30. The wiring portion 62 has the predetermined pattern. The wiring portion 62 is wound in a spiral form from an inner position toward an outer position of the fourth component member 60. For example, a center of the spiral form coincides with a center of the fourth component member 60.

The wiring portion 42 is provided with a first connecting portion 42a at an outer end thereof to expose from the low-permittivity film 41 and a second connecting portion 42b at an inner end thereof to expose from the low-permittivity film 41. The wiring portion 52 is provided with a first connecting portion 52a at an outer end thereof to expose from the low-permittivity film 41 and a second connecting portion 52b at an inner end thereof to expose from the low-permittivity film 51.

The wiring portion 62 is provided with a first connecting portion 62a at an outer end thereof to expose from the low-permittivity film 61 and a second connecting portion 62b at an inner end thereof to expose from the low-permittivity film 61.

Specifically, with regard to the second component member 40, the first connecting portion 42a exposes from a first surface of the low-permittivity film 41 facing the third component member 50, and the second connecting portion 42b exposes from a second surface of the low-permittivity film 41 facing the first component member 30. With regard to the third component member 50, the first connecting portion 52a exposes from a first surface of the low-permittivity film 51 facing the second component member 40, and the second connecting portion 52b exposes from a second surface of the low-permittivity film 51 facing the fourth component member 60. With regard to the fourth component member 60, the first connecting portion 62a exposes from a first surface of the low-permittivity film 61 opposite to the third component member 50, and the second connecting portion 62b exposes from a second surface of the low-permittivity film 61 facing the third component member 50.

The second component member 40 further includes conductive parts 43 on a periphery of an area where the wiring portion 42 is disposed. For example, the second component member 40 has four conductive parts 43. Each of the four conductive parts 43 is spaced from the center of the second component member 40 by the predetermined distance, which is the same as the predetermined distance from the center of the first component member 30 to each conductive part 33. Further, the four conductive parts 43 are point symmetrical with respect to the center of the second component member 40.

Likewise, the third component member 50 further includes conductive parts 53 on a periphery of an area where the wiring portion 52 is disposed. For example, the third component member 50 has four conductive parts 53. Each of the four conductive parts 53 is spaced from the center of the third component member 50 by the predetermined distance, which is the same as the predetermined distance from the center of the first component member 30 to each conductive part 33. Further, the four conductive parts 53 are point symmetrical with respect to the center of the third component member 50.

The fourth component member 60 further includes conductive parts 63 on a periphery of an area where the wiring portion 62 is disposed. For example, the fourth component member 60 has four conductive parts 63. Each of the four conductive parts 63 is spaced from the center of the fourth component member 60 by the predetermined distance, which is the same as the predetermined distance from the center of the first component member 30 to each conductive part 33. Further, the four conductive parts 63 are point symmetrical with respect to the center of the fourth component member 60.

The first through fourth component members 30, 40, 50, 60 have the aforementioned structures. In the present embodiment, the first through fourth component members 30, 40, 50, 60 have the same shape. That is, the first through fourth component members 30, 40, 50, 60 are the same members. For example, considering the first component member 30 as a reference, the first component member 30 coincides with each of the second through fourth component members 40, 50, 60 by turning around and/or turning over.

Figure 3C:
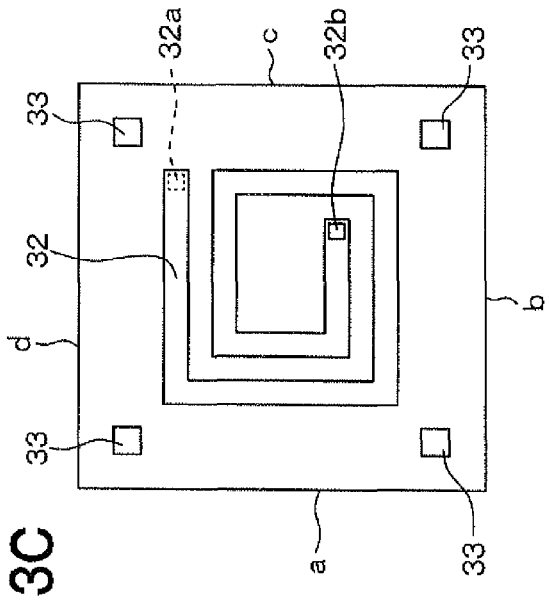
FIGS. 3A through 3C are schematic plan views of the first component member shown in FIG. 1 when moved in various ways.
Figure 3A:
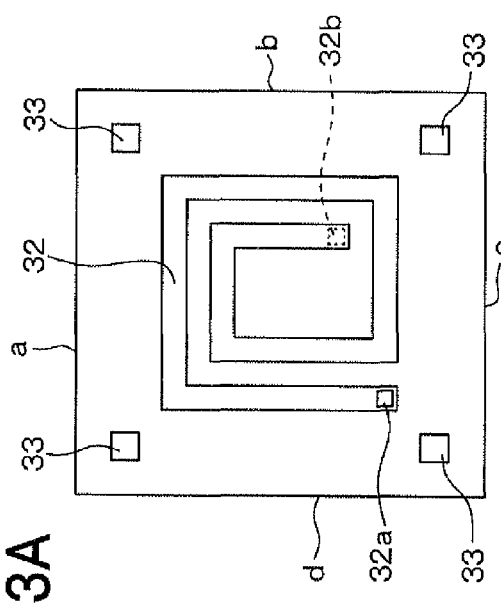
Figure 3B:
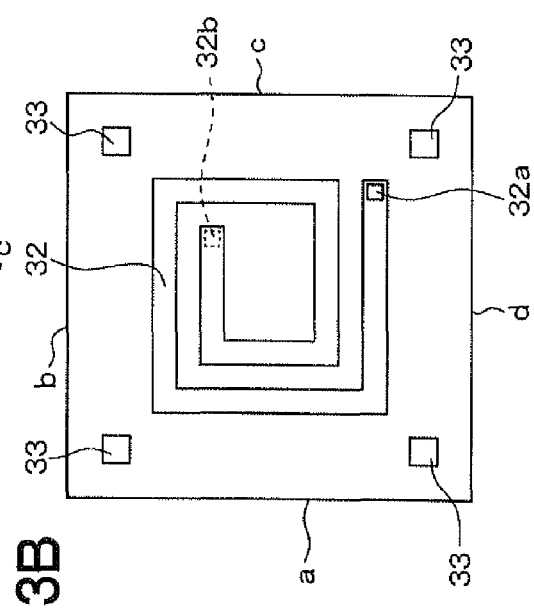

The example will be given with regard to the second component member 40. FIGS. 3A through 3C are plan views of the first component member 30 viewed from the circuit board 10, that is, from the bottom side in FIG. 1. In FIGS. 3B and 3C, the first component member 30 is turned in respective manner from the position shown in FIG. 3A.

As shown in FIG. 3A, assuming that an upper side extending in a paper right and left direction is a first side a, a right side extending in a paper up and down direction is a second side b, a lower side extending in the paper right and left direction is a third side c, a left side extending in the paper up and down direction is a fourth side d, the first component member 30 coincides with the second component member 40 by moving in the following manner.

The first component member 30 shown in FIG. 3A is turned 90 degrees about the center in a counterclockwise direction, as shown in FIG. 3B, and then is flipped relative to the fourth side d, that is, turned upside down, as shown in FIG. 3O. As such, the first component member 30 coincides with the second component member 40 shown in FIG. 2B.

Although not illustrated, if the first component member 30 is turned 180 degrees about the center, the first component member 30 coincides with the third component member 50 shown in FIG. 2C. Also, if the first component member 30 is turned 90 degrees in a counterclockwise direction about the center, and flipped relative to the third side c, the first component member 30 coincides with the fourth component member 60 shown in FIG. 2D.

As shown in FIG. 1, the coil layer part 21 is constructed by layering the aforementioned first through fourth component members 30, 40, 50, 60. Specifically, the first component member 30, and the second component member 40 are bonded to each other. The second component member 40 and the third component member 50 are bonded to each other. Further, the third component member 50 and the fourth component member 60 are bonded to each other.

In the coil layer part 21, the second connecting portion 32b of the first component member 30 is connected to the second connecting portion 42b of the second component member 40. The first connecting portion 42a of the second component member 40 is connected to the first connecting portion 52a of the third component member 50. The second connecting portion 52b of the third component member 50 is connected to the second connecting portion 62b of the fourth component member 60. As such, in the coil layer part 21, the coil 20 is constructed of the wiring portions 32, 42, 52, 62 connected through the first and second connecting portions 32a, 32b, 42a, 42b, 52a, 52b, 62a, 62b.

In addition, in the coil layer part 21, the conductive parts 33 of the first component member 30 are connected to the conductive parts 43 of the second component member 40. Further, the conductive parts 43 of the second component member 40 are connected to the conductive parts 53 of the third component member 50. Moreover, the conductive parts 53 of the third component member 50 are connected to the conductive parts 63 of the fourth component member 60.

The first connecting portion 32a and the conductive parts 33 of the first component member 30 are connected to the metal films 13 disposed on the circuit board 10. A connecting wiring portion 70 is provided on a surface of the coil layer part 21 opposite to the circuit board 10. The connecting wiring portion 70 electrically connects the first connecting portion 62a and the conductive part 63 of the fourth component member 60 to electrically connect the coil 20 and the conductive parts 33, 43, 53, 63.

Next, a manufacturing process of such a semiconductor device will be described. FIGS. 4A through 4E, 5A through 5D and 6A through 6D are cross-sectional views for showing the manufacturing process of the semiconductor device according to the present embodiment. Hereinafter, the manufacturing process will be described with regard to a semiconductor device in which the coil layer part 21 is constructed by layering the first through fourth component members 30, 40, 50, 60 as an example.

Figure 4A:
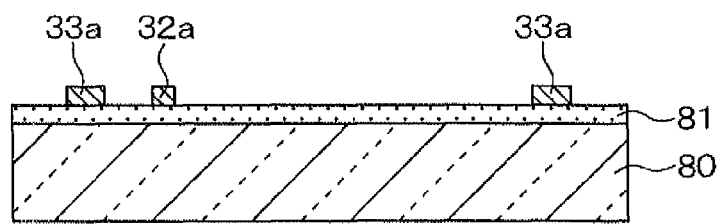
FIGS. 4A through 4E, 5A through 5D, and 6A through 6D are cross-sectional views for showing a manufacturing process of the semiconductor device shown in FIG. 1.

In a step shown in FIG. 4A, a support substrate 80 that has a flat surface and is made using glass, a photosensitive film or the like is prepared. A removable layer 81 is deposited on the flat surface of the support substrate 80. The removable layer 81 is made of an ultraviolet curable resin, a photosensitive resist or the like, which is capable of being separated from the support substrate 80 by a chemical reaction. Conductive parts 33a and the first connecting portion 32a are formed on the removable layer 81 by a screen printing technique, a mask deposition technique, or the like.

Figure 4B:
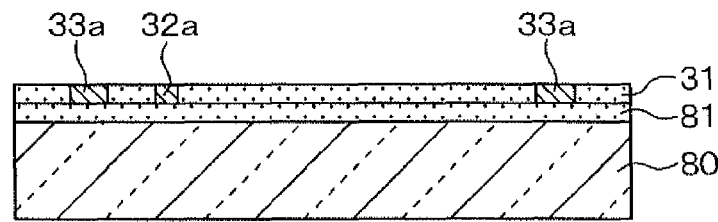

In a step shown in FIG. 4B, the low-permittivity film 31 is deposited by a spin coating technique or the like and cured by heating. At this time, the low-permittivity film 31 is deposited such that the conductive parts 33a and the first connecting portion 32a are exposed from a surface of the low-permittivity film 31 opposite to the support substrate 80.

Figure 4C:
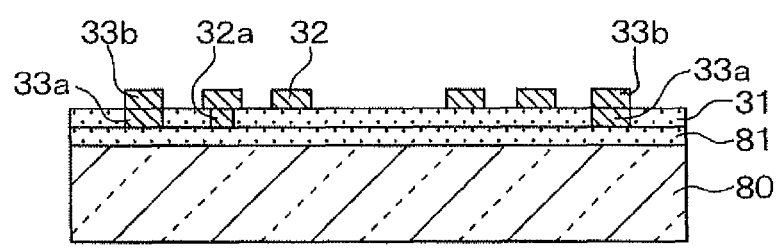

In a step shown in FIG. 4C, conductive parts 33b and the wiring portion 32 are formed on the conductive parts 33a and the low-permittivity film 31 by a screen printing technique, a mask deposition technique, or the like, to be electrically connected to the conductive parts 33a and the first connecting portion 32a, respectively. It is to be noted that, as shown in FIG. 2, the wiring portion 32 is formed in the spiral form that is wound from the inner position toward the outer position and has the center coinciding with the center of the support substrate 80. Further, the outer end of the wiring portion 32 is connected to the first connecting portion 32a.

Figure 4D:
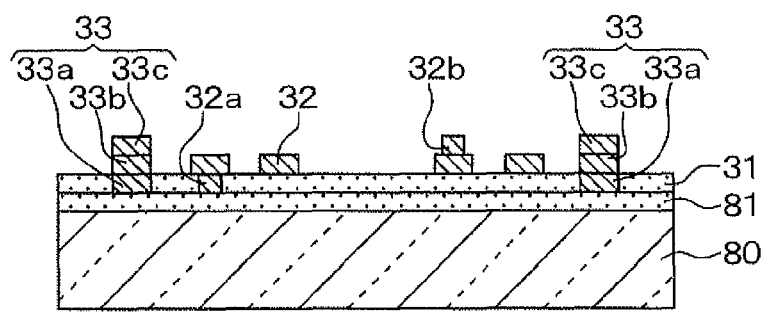

In a step shown in FIG. 4D, conductive parts 33c and the second connecting portion 32b are formed on the conductive parts 33b and the inner end of the wiring portion 32 by a screen printing technique, a mask deposition, or the like, to be electrically connected to the conductive parts 33b and the wiring portion 32, respectively.

Figure 4E:
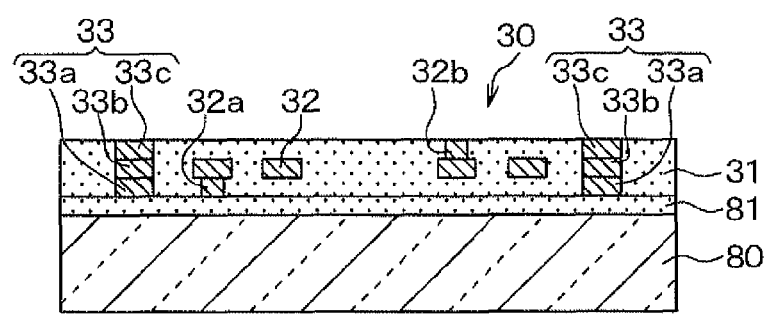

In a step shown in FIG. 4E, the low-permittivity film 31 is deposited by a spin coating technique or the like and cured by heating. In this way, the first component member 30 is formed on the support substrate 80. In this case, the second connecting portion 32b and the conductive parts 33c are exposed from the surface of the low-permittivity film 31 opposite to the support substrate 80. The conductive parts 33a, 33b, 33c constitute the conductive part 33.

In a case where the wiring portion 32, the first and second connecting portions 32a, 32b and the conductive portions 33a, 33b, 33c are formed by the screen printing technique in the steps shown in FIGS. 4A, 4C and 4D, a step of removing solvent by calcinating is performed in each of the steps shown in FIGS. 4A, 4C, and 4D.

As described above, the second through fourth component members 40, 50, 60 have the same shape as the first component member 30. Therefore, the second through fourth component members 40, 50, 60 are formed on the support substrates 80 by the steps shown in FIGS. 4A through 4E, in the similar manner to the first component member 30.

Figure 5A:
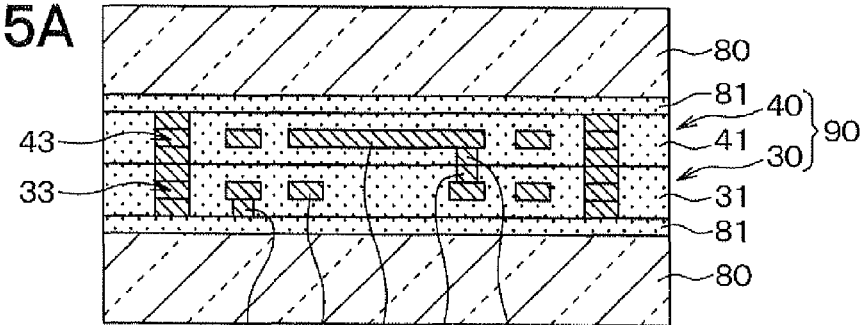

In a step shown in FIG. 5A, the first component member 30 formed on the support substrate 80 and the second component member 40 formed on another support substrate 80 are opposed to each other, and bonded to each other by applying pressure under the atmosphere or a low vacuum condition. As such, a first layered body 90 having the support substrates 80 at opposite ends with respect to a layering direction is formed. Here, the layering direction means a direction in which the component members 30, 40, 50, 60 are layered and corresponds to a direction perpendicular to the surface of the support substrate 80 or the surface of the circuit board 10.

Specifically, the first component member 30 with the support substrate 80 and the second component member 40 with the support substrate 80 are placed such that the second connecting portion 32b of the first component member 30 is opposed to the second connecting portion 42b of the second component member 40. Further, the first component member 30 with the support substrate 80 and the second component member 40 with the support substrate 80 are held such that the flat surfaces of the support substrates 80 are parallel to each other. In this condition, the wiring portion 32 of the first component member 30 and the wiring portion 42 of the second component member 40 are connected to each other through the second connecting portions 32b, 42b. In this way, the first layered body 90 is formed.

The second connecting portion 32b of the first component member 30 and the second connecting portion 42b of the second component member 40 are opposed to each other in the following manner.

As shown in FIG. 3, the second component member 40 with the support substrate 80 is first placed in a condition according with the first component member 30, and then turned 90 degrees in the counterclockwise direction and turned upside down. Thus, the second component member 40 with the support substrate 80 can be placed relative to the first component member 30 with the support substrate 80 such that the second connecting portion 42b of the second component member 40 is opposed to the second connecting portion 32b of the first component member 30. Such a process can be performed using a general bonding apparatus, for example.

For example, the first component member 30 and the second component member 40 are bonded to each other by a surface activated bonding technique in which Argon (Ar) ion is radiated to bonding surfaces of the first component member 30 and the second component member 40 to activate the bonding surfaces, and the activated bonding surfaces are bonded to each other.

In the surface activated bonding technique, activated surfaces are bonded at the temperature lower than a bonding temperature of another bonding technique such as a thermal compression bonding technique in which members are bonded by being heated higher than a melting point of the members or being softened. Therefore, in the case where the first component member 30 and the second component member 40 are bonded by the surface activated bonding technique, an occurrence of thermal stress due to a difference of coefficient of thermal expansion between the wiring portions 32, 42, the low-permittivity films 31, 41, the conductive parts 33, 43 and the support substrates 80 is reduced. As such, it is less likely that the first layered body 90 will be curved.

Figure 5B:
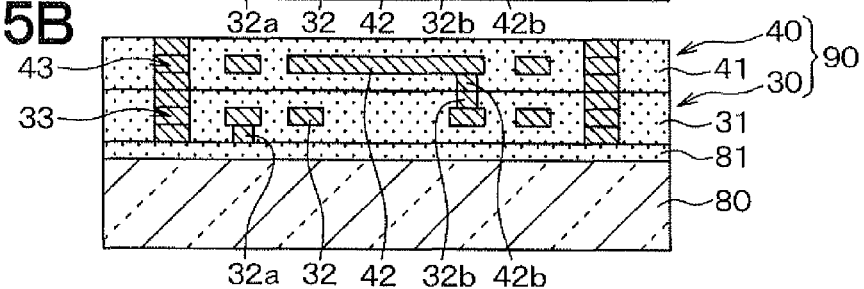

Next, in a step shown in FIG. 5B, the support substrate 80 and the removable layer 81 adjacent to the second component member 40 are removed from the first layered body 90. For example, in a case where the ultraviolet curable resin is used as the removable layer 81, an ultraviolet light having a predetermined wavelength is radiated to the removable layer 81 adjacent to the second component member 40 to cure the removable layer 81. Thus, the support substrate 80 is separated from the first layered body 90. Further, the removable layer 81 is separated from the first layered body 90, for example, by ashing.

The third component member 50 with the support substrate 80 and the fourth component member 60 with another support substrate 80 are bonded to each other in the similar manner to the step shown in FIG. 5A, to form a second layered body 91. Further, the support substrate 80 and the removable layer 81 adjacent to the third component member 50 are removed from the second layered body 91 in the similar manner to the step shown in FIG. 5B.

Figure 5C:
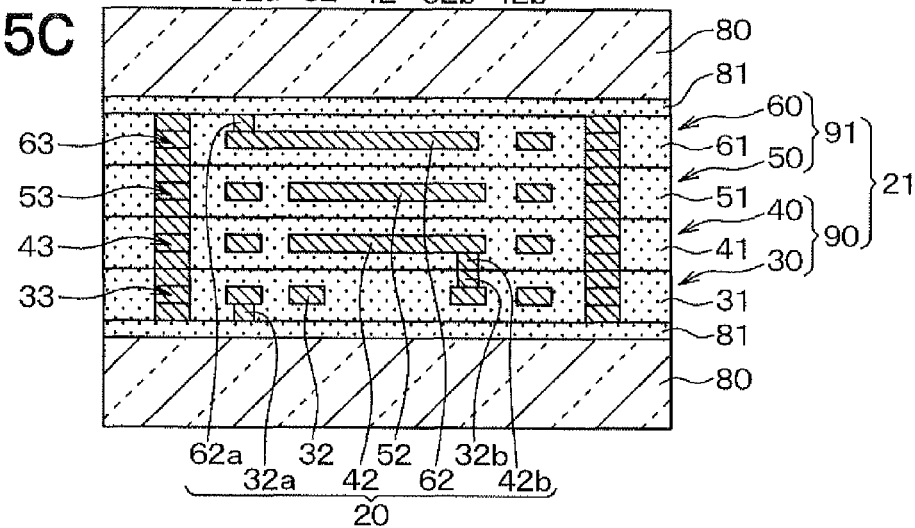

Next, in a step shown in FIG. 5C, the first layered body 90 and the second layered body 91 are placed such that the surface from which the support substrates 80 and the removable layers 81 have been removed are opposed to each other. In this condition, the first layered body 90 and the second layered body 91 are bonded to each other while applying pressure. As such, the coil layer part 21 having the support substrates 80 at opposite ends is formed.

Specifically, the first layered body 90 and the second layered body 91 are placed such that the first connecting portion 42a that is located opposite to the support substrate 80 of the first layered body 90 and the first connecting portion 52a that is located opposite to the support substrate 80 of the second layered body 91 are opposed to each other. That is, the first connecting portion 42a of the second component member 40 and the first connecting portion 52a of the third component member 50 are opposed to each other.

Then, while maintaining the flat surfaces of the support substrates 80 of the first layered body 90 and the second layered body 91 parallel to each other, the wiring portions 32, 42, 52, 62 of the first through fourth component members 30, 40, 50, 60 are connected through the first and second connecting portions 32a, 32b, 42a, 42b, 52a, 52b, 62a, 62b, thereby forming the coil layer part 21. In this way, the coil 20 constructed of the wiring portions 32, 42, 52, 62, the first connecting portions 32a, 42a, 52a, 62a and the second connecting portions 32b, 42b, 52b, 62b is formed in the coil layer part 21.

The first connecting portion 42a of the second component member 40 and the first connecting portion 52a of the third component member 50 are opposed to each other in the following manner.

First, the second layered body 91 is placed in a condition coinciding with the first layered body 90. Then, the second layered body 91 is turned 90 degrees in a counterclockwise direction, and flipped relative to a left side or a right side. Thus, the first connecting portion 52a of the third component member 50 can be opposed to the first connecting portion 42a of the second component member 40. The first layered body 90 and the second layered body 91 are bonded by a surface activated bonding technique, in the similar manner shown in FIG. 5A.

Figure 5D:
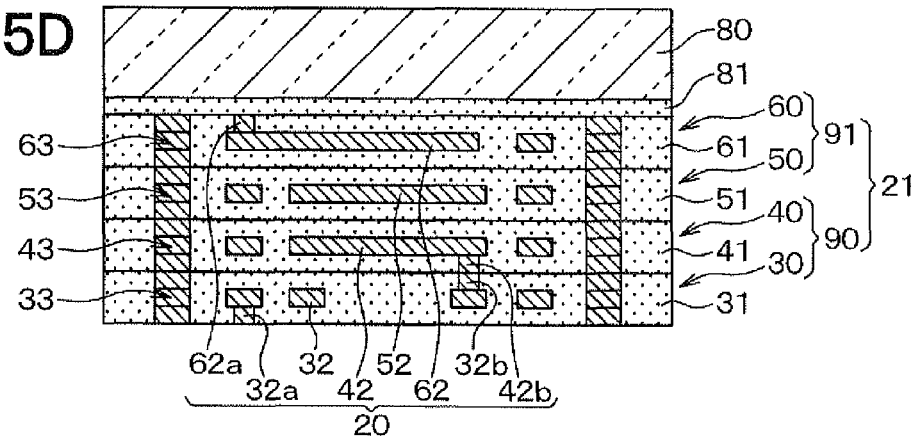

Next, in a step shown in FIG. 5D, the support substrate 80 and the removable layer 81 adjacent to the first component member 30 are removed from the coil layer part 21. For example, in a case where the ultraviolet curable resin is used as the removable layer 81, in the similar manner shown in FIG. 5B, an ultraviolet light having a predetermined wavelength is radiated to cure the removable layer 81. Thus, the support substrate 80 is separated. Further, the removable layer 81 can be removed, for example, by ashing.

Next, the coil layer part 21 manufactured in the above manner is mounted on the circuit board 10. For example, in a step shown in FIG. 6A, the circuit board 10 is prepared. The insulation film 11 is deposited on the surface of the circuit board 10. The openings 12 are formed in the insulation film 11 at positions to be opposed to the first connecting portion 32a and the conductive parts 33 of the first component member 30.

Figure 6A:
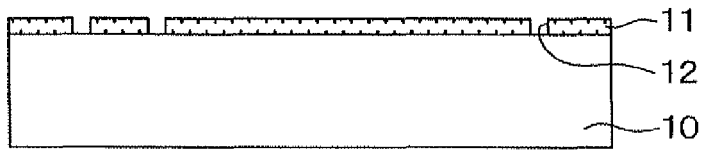
Figure 6B:
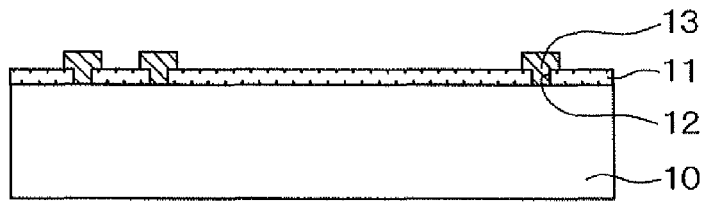

In a step shown in FIG. 6B, a film of Au, Cu, Al or the like is formed on the insulation film 11, and is patterned by a photo-etching technique to form the metal films 13 in the opening 12.

Figure 6C:
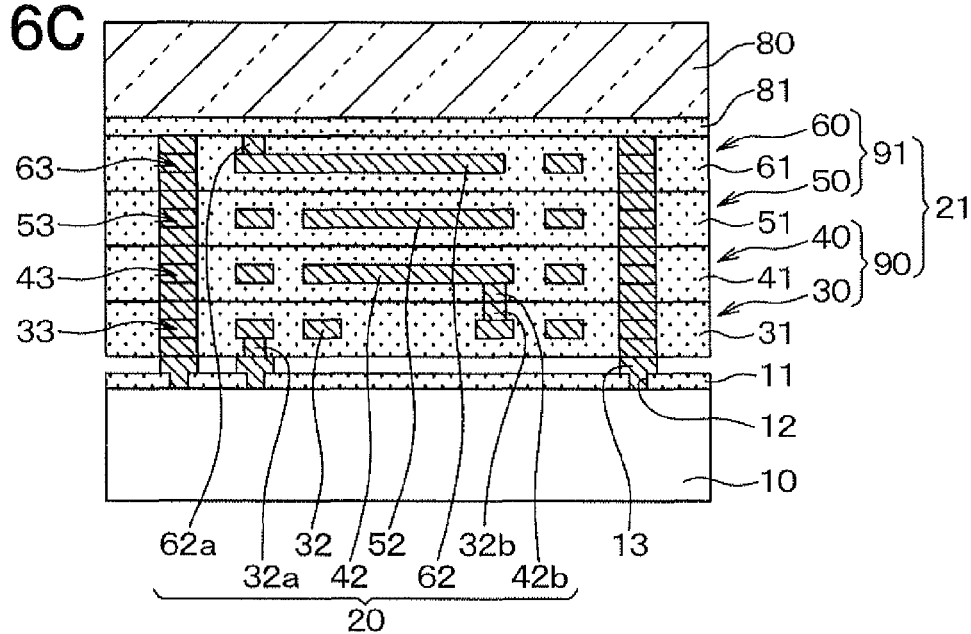

In a step shown in FIG. 6C, the coil layer part 21 prepared in the step of FIG. 5D is mounted on the circuit board 10. Specifically, the first connecting portion 32a and the conductive parts 33 of the first component member 30 are bonded to the metal films 13. In this case, for example, an underfill material can be placed between the circuit board 10 and the coil layer part 21 so as to improve bonding strength of respective bonding portions.

Figure 6D:
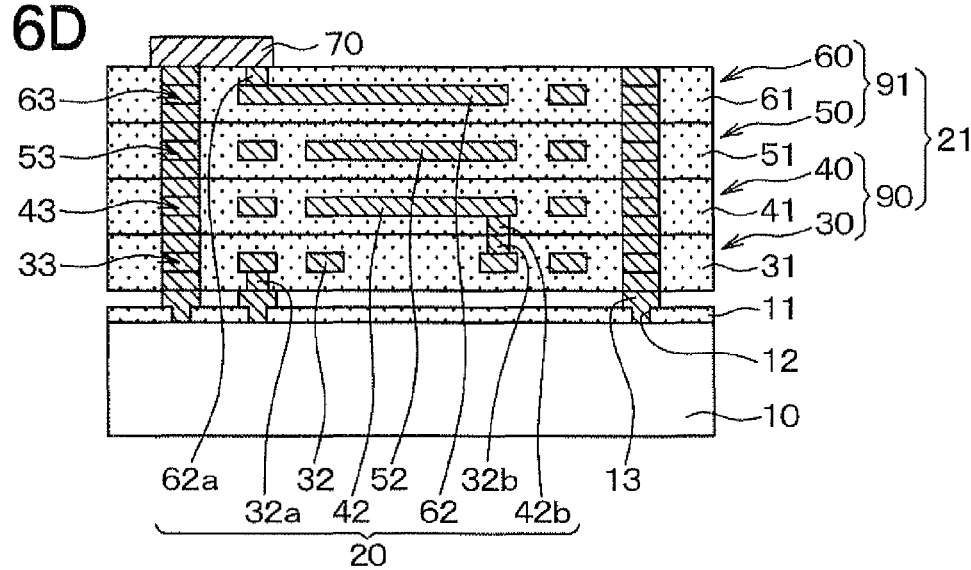

In a step shown in FIG. 6D, the support substrate 80 and the removable layer 81 adjacent to the fourth component member 60 are removed from the coil layer part 21. Then, the connecting wiring portion 70 for electrically connecting the conductive parts 63 and the first connecting portion 62a of the fourth component member 60 is formed, so that the coil 20 is electrically connected to the conductive parts 33, 43, 53, 63. In this way, the semiconductor device is manufactured.

The connecting wiring portion 70 is, for example, formed by a mask deposition technique or the like using Cu, Au, Al or the like. The support substrate 80 and the removable layer 81 are separated, for example, by radiating an ultraviolet light or ashing, in the similar manner in FIG. 5B.

In the manufacturing process of the semiconductor device according to the present embodiment, the coil layer part 21 accommodating the coil 20 therein is first formed, and then is mounted on the circuit board 10. The coil layer part 21 is manufactured by bonding the first through fourth component members 30, 40, 50, 60 attached to the support substrate 80 while applying pressure, and connecting the wiring portions 32, 42, 52, 62 of the first through fourth component members 30, 40, 50, 60 through the first and second connecting portions 32a, 32b, 42a, 42b, 52a, 52b, 62a, 62b while maintaining the flat surfaces of the support substrate 80 parallel to each other.

For example, even if the bonding surfaces of the first and second component members 30, 40 are rough surfaces, that is, have projections or recessions, since the first component member 30 and the second component member 40 are bonded while applying pressure in the condition where the flat surfaces of the support substrates 80 are maintained parallel to each other, the projections and recessions are contained inside.

That is, it is less likely that an extension direction of the coil 20 will be inclined relative to the layering direction of the first through fourth component members 30, 40, 50, 60, even though the surface of each of the first through fourth component members 30, 40, 50, 60 opposite to the support substrate 80 is not flattened such as by polishing after each of the first through fourth component members 30, 40, 50, 60 is formed on the support substrate 80. Further, when the coil layer part 21 is laid on the surface of the circuit board 10, it is less likely that the extension direction of the coil 20 will be inclined relative to the direction of the normal to the surface of the circuit board 10.

Moreover, the first through fourth component members 30, 40, 50, 60 have the wiring portions 32, 42, 52, 62 formed in the same pattern. Therefore, for example, in a case where the wiring portions 32, 42, 52, 62 are formed by a mask deposition technique or the like, only one mask pattern is used.

In addition, the removable layers 81, which are capable of being separated from the support substrates 80 by the chemical reaction, are formed on the support substrates 80, and the first through fourth component members 30, 40, 50, 60 are formed on the removable layers 81, respectively. The support substrates 80 are separated from the first through fourth component members 30, 40, 50, 60 by chemically reacting the removable layers 81. Therefore, the support substrates 80 can be reused.

(Second Embodiment)

A second embodiment will be described hereinafter with reference to FIGS. 7 through 10D.

Figure 7:
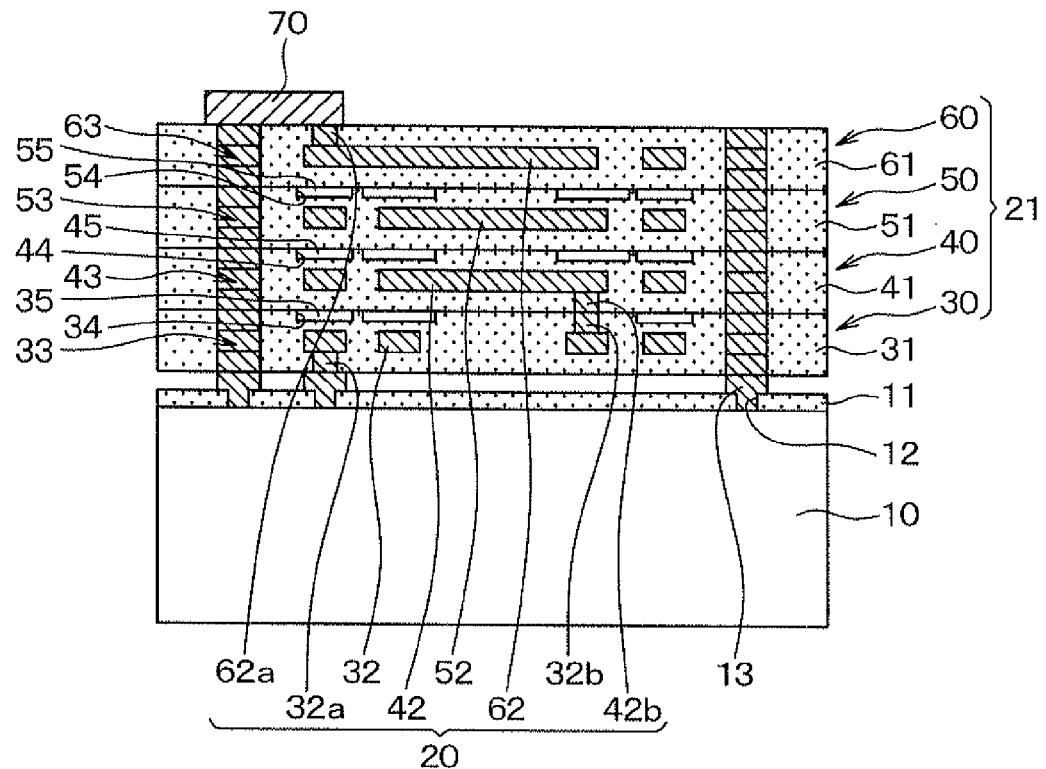
FIG. 7 is a cross-sectional view of a semiconductor device manufactured by a manufacturing method according to a second embodiment of the present invention.

A semiconductor device according to the present embodiment has accommodation space between the adjacent two component members, in addition to the structure of the first embodiment. Other structures are similar to the semiconductor device of the first embodiment, and thus a description thereof will not be repeated. FIG. 7 is a cross-sectional view of the semiconductor device according to the present embodiment.

As shown in FIG. 7, the first component member 30 is formed with multiple recesses 34 on the second surface facing the second component member 40. An accommodation space 35 is formed by each of the recesses 34 and the second component member 40. Likewise, the second component member 40 is formed with multiple recesses 44 on the first surface facing the third component member 50. An accommodation space 35 is formed by each of the recesses 44 and the third component member 50.

Further, the third component member 50 is formed with multiple recesses 54 on the second surface facing the fourth component member 60. An accommodation space 55 is formed by each of the recesses 54 and the fourth component member 60.

Figure 8:
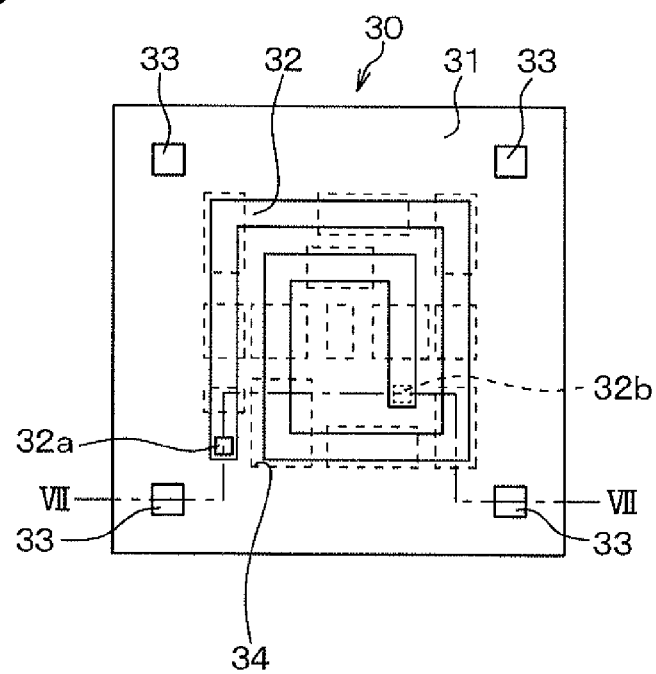
FIG. 8 is a schematic plan view of a first component member of a coil layer part of the semiconductor device shown in FIG. 7.
Figure 9A:
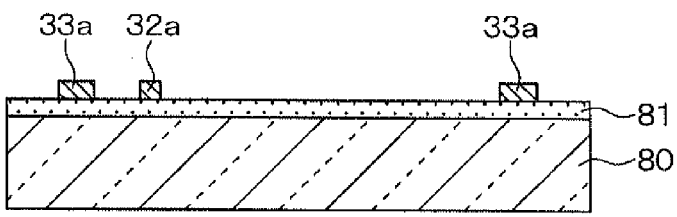
Figure 9B:
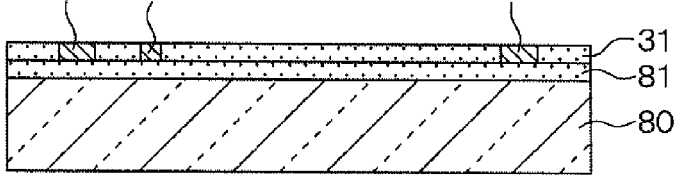
Figure 9C:
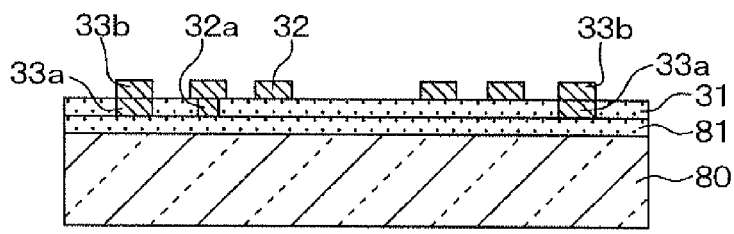
Figure 9D:
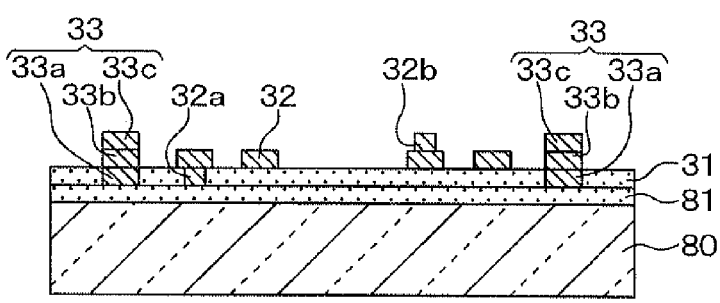
Figure 9E:
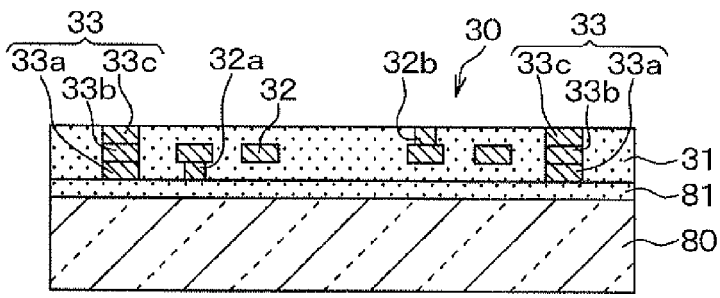
Figure 9F:
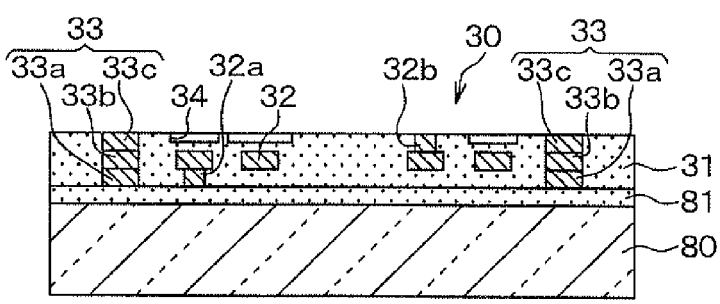

FIG. 8 is a plan view of the first component member 30, when viewed from the circuit board 10, that is, from the bottom side in FIG. 7. The cross-sectional view of FIG. 7 corresponds to a view taken along a line VII-VII in FIG. 8.

As shown in FIGS. 7 and 8, the first component member 30 is formed with the multiple recesses 34 on the second surface facing the second component member 40. For example, at the second surface, the recesses 34 are formed in a first area corresponding to the wiring portion 32 other than a portion where the second connecting portion 32b exposes and in a second area located inside of the first area, that is, surrounded by the first area. Further, the recesses 34 are spaced from each other. The accommodation spaces 35 are provided by the recesses 34 and the second component member 40, in a condition where the first component member 30 and the second component member 40 are joined to each other. That is, the multiple accommodation spaces 35 are provided between the first component member 30 and the second component member 40.

As described above, the first through fourth component members 30, 40, 50, 60 have the same shape, and the wiring portions 32, 42, 52, 62 have the spiral form defining a spiral axis passing through the centers of the first through fourth component members 30, 40, 50, 60. The recesses 34 formed in the first area provide the accommodation space 35 between the wiring portion 32 and the wiring portion 42. The second area corresponds to an area located inside of the coil 20 when the coil 20 is formed.

Although not illustrated, the second component member 40 is formed with the multiple recesses 44, similar to the first component member 30. The multiple recesses 44 are formed in a first area corresponding to the wiring portion 42 other than a portion where the first connecting portion 42a exposes and in a second area inside of the first area. The multiple recesses 44 are spaced from each other.

The third component member 50 is formed with the multiple recesses 54, similar to the first component member 30. The multiple recesses 54 are formed in a first area corresponding to the wiring portion 52 other than a portion where the second connecting portion 52b exposes and in a second area inside of the first area. The multiple recesses 54 are spaced from each other.

Next, a manufacturing method of the semiconductor device having the aforementioned structure will be described. FIGS. 9A through 9F and 10A through 10D show a manufacturing process of the semiconductor device according to the present embodiment.

First, steps shown in FIGS. 9A through 9E are performed, similar to the steps shown in FIGS. 4A through 4E. Thereafter, in a step shown in FIG. 9F, the recesses 34 are formed on a surface of the low-permittivity film 31 opposite to the support substrate 80 by a photo-etching technique or the like. Thus, the first component member 30 is formed.

The third component member 50 is formed in the similar manner to the first component member 30. That is, the recesses 54 are formed on a surface of the low-permittivity film 51 opposite to the support substrate 80.

In a step shown in FIG. 10A, the first component member 30 attached to the support substrate 80 and the second component member 40 attached to the support substrate 80 are placed such that the first component member 30 and the second component member 40 are opposed to each other. In this condition, the first component member 30 and the second component member 40 are bonded to each other by a surface activated bonding technique or the like while applying pressure. As such, a first layered body 90 having the support substrates 80 at the opposite ends is formed. Also, the accommodation spaces 35 are formed between the first component member 30 and the second component member 40.

Since the first component member 30 and the second component member 40 are bonded to each other while applying pressure, air bubbles contained between the first component member 30 and the fourth component member 40 are forced into the accommodation spaces 35. Therefore, it is less likely that the air bubbles will remain in an area other than the accommodation spaces 35 between the first component member 30 and the second component member 40.

In a step shown in FIG. 10B, the support substrate 80 and the removable layer 81, which are adjacent to the second component member 40, are removed from the first layered body 90. Then, the recesses 44 are formed on a surface of the first layered body 90 from which the support substrate 80 and the removable layer 81 have been removed, that is, on the first surface of the second component member 40 opposite to the first component member 30, by a photo-etching technique or the like.

Further, a second layered body 91 in which the third component member 50 and the fourth component member 60 are bonded to each other is formed in the similar manner to the step shown in FIG. 10A. In the second layered body 91, the accommodation spaces 55 are formed between the third component member 50 and the fourth component member 60. Thereafter, the support substrate 80 and the removable layer 81, which are adjacent to the third component member 50, are removed from the second layered body 91.

In a step shown in FIG. 10C, the first layered body 90 and the second layered body 91 are placed such that the first surface of the second component member 40 and the first surface of the third component member 50 from which the support substrates 80 have been removed, are opposed to each other. In this condition, the second component member 40 and the third component member 50 are bonded to each other by a surface activated bonding technique or the like while applying pressure.

As such, the coil layer part 21 having the support substrates 80 at the opposite ends is formed. The accommodation spaces 45 are formed between the second component member 40 and the third component member 50. Since the first layered body 90 and the second layered body 91 are bonded to each other while applying pressure, air bubbles contained between the first layered body 90 and the second layered body 91, that is, air bubbles contained between the second component member 40 and the third component member 50 are forced into the accommodation spaces 45. Therefore, it is less likely that the air bubbles will remain in an area other than the accommodation spaces 45 between the second component member 40 and the third component member 50.

In a step shown in FIG. 10D, the support substrate 80 and the removable layer 81 are removed from the first component member 30. Thereafter, the coil layer part 21 is mounted on the circuit board 10, and the connecting wiring portion 70 is formed on the fourth component member 60, in the similar manner to the first embodiment shown in FIGS. 6A through 6D.

As described above, in the present embodiment, the first component member 30 is formed with the recesses 34. When the first component member 30 is bonded to the second component member 40, the accommodation spaces 35 are formed between the first component member 30 and the second component member 40. The bonding between the first component member 30 and the second component member 40 is performed while applying pressure. Therefore, even if the air bubbles are contained between the first component member 30 and the second component member 40, the air bubbles are forced into the accommodation spaces 35.

Likewise, the third component member 50 is formed with the recesses 54. When the third component member 50 is bonded to the fourth component member 60, the accommodation spaces 55 are formed between the third component member 50 and the fourth component member 60. The bonding between the third component member 50 and the fourth component member 60 is performed while applying pressure. Therefore, even if the air bubbles are contained between the third component member 50 and the fourth component member 60, the air bubbles are forced into the accommodation spaces 55.

The second component member 40 is formed with the recesses 44. When the second component member 40 and the third component member 50 are bonded to each other, the accommodation spaces 45 are formed between the second component member 40 and the third component member 50. The bonding between the second component member 40 and the third component member 50, that is, the bonding between the first layered body 90 and the second layered body 91 is performed while applying pressure. Therefore, even if the air bubbles are contained between the second component member 40 and the third component member 50, the air bubbles are forced into the accommodation spaces 45.

Therefore, it is less likely that the air bubbles will remain in the areas other than the accommodation spaces 35, 45, 55 between the first component member 30 and the second component member 40, between the second component member 40 and the third component member 50 and between the third component member 50 and the fourth component member 60. As such, poor electrical connection and unevenness of a coil characteristic can be reduced in each product.

Further, the recesses 34, 44, 54 are formed in the first areas opposing to the wiring portions 32, 42, 52 in the first through third component members 30, 40, 50, respectively. Therefore, as compared with a case where the recesses 34, 44, 54 are formed outside of the first areas corresponding to the wiring portions 32, 42, 52, the existence of the air bubbles in the areas other than the accommodation spaces 35, 45, 55 is effectively reduced. Accordingly, unevenness of the coil characteristic can be reduced.

The recesses 34, 44, 54 are also formed in the second areas located inside of the first areas corresponding to the wiring portions 32, 42, 52. Therefore, as compared with a case where the recesses 34, 44, 54 are formed outside of the second areas, the existence of the air bubbles in the areas other than the accommodation spaces 35, 45, 55 is effectively reduced. Accordingly, unevenness of the coil characteristic can be reduced In the present embodiment, the recesses 34, 44, 54 are formed in the first areas and the second areas. Thus, it is less likely that the air bubbles will remain in the areas other than the first areas and the second areas. In other words, the air bubbles will not remain between the conductive parts 33, 43, 53, 63. Also, the air bubbles will not remain between the first and second connecting portions 32b, 42a, 42b, 52a, 52b, 62b. Therefore, poor electrical connections between the respective conductive parts 33, 43, 53, 63 and between the first and second connecting portions 32b, 42a, 42b, 52a, 52b, 62b can be reduced.

Since the air bubbles will not remain between the respective wiring portions 32, 42, 52, 62, variations in electric permittivity between the respective wiring portions 32, 42, 52, 62 will be reduced. As such, unevenness of the coil characteristic between the products can be reduced. In addition, the air bubbles will not remain between the component members 30, 40, 50, 60 other than the accommodation spaces 35, 45, 55, variations in magnetic permeability will be reduced. As such, unevenness of the coil characteristic can be reduced.

The semiconductor device according to the present embodiment can be, for example, employed to form a transformer with reduced unevenness in the coil characteristic between a primary coil and a secondary coil.

(Third Embodiment)

A third embodiment will be described hereinafter with reference to FIG. 11. In the third embodiment, the shape of the recesses 34, 44, 54 are modified from those of the second embodiment. Other structures are similar to the second embodiment, and thus a description thereof will not be repeated.

Figure 11:
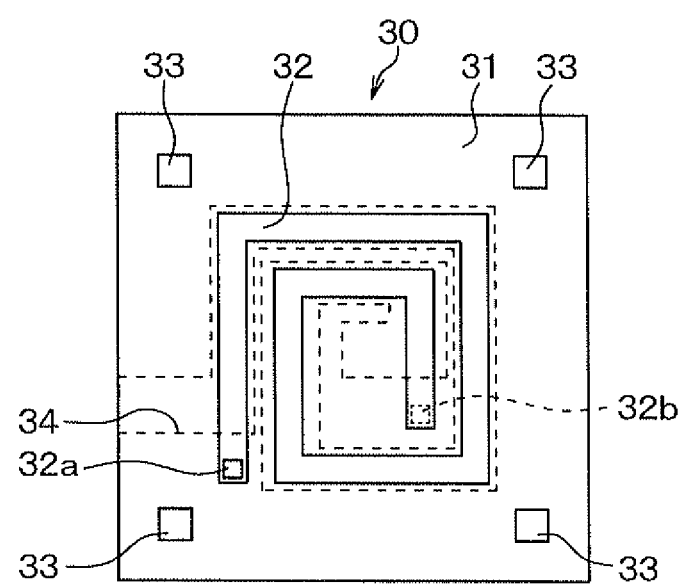
FIG. 11 is a schematic plan view of a first component member of a coil layer part of a semiconductor device according to a third embodiment of the present invention.

FIG. 11 is a plan view of the first component member 30 according to the present embodiment, when viewed from the circuit board 10, that is, from the bottom side in FIG. 7.

As shown in FIG. 11, in the present embodiment, the recess 34 is not divided into multiple portions. That is, the recess 34 has a continuous shape, and is formed in a first area corresponding to the wiring portion 32 other than a portion from which the second connecting portion 32b exposes and a second area inside of the first area. Here, the second area is continuous from the first area. Further, the recess 34 extends to an outer end of the first component member 30 to be communicated with an outside of the first component member 30. In other words, the recess 34 forms an opening at the outer end of the first component member 30. Thus, the accommodation space 35 formed between the first component member 30 and the second component member 35 is in communication with the outside of the first component member 30 and the second component member 40.

Although not illustrated, the recesses 44, 54 of the second and third component members 40, 50 have the similar shape as the recess 34. Thus, the recess 44 has the continuous shape and is in communication with an outside of the second component member 40. The accommodation space 45 formed between the second component member 40 and the third component member 50 is in communication with the outside of the second component member 40 and the third component member 50.

Likewise, the recess 54 has the continuous shape and is in communication with an outside of the third component member 50. The accommodation space 55 formed between the third component member 50 and the fourth component member 60 is in communication with the outside of the third component member 50 and the fourth component member 60.

In the present embodiment, the existence of the air bubbles in the areas other than the accommodation spaces 35, 45, 65 between the first through fourth component members 30, 40, 50, 60 is further reduced, as compared with the second embodiment. That is, in the present embodiment, since the recess 34 extends to the outer end of the first component member 30 and is in communication with the outside of the coil layer part 21, the air bubbles with the volume over the capacity of the accommodation space 35 will not be contained between the first component member 30 and the second component member 40.

For example, even if the air bubbles with the volume over the capacity of the accommodation space 35 is contained between the first component member 30 and the second component member 40, a part of the air bubbles can be discharged from an end of the accommodation space 35 that opens at the outer end of the first component member 30. Accordingly, it is less likely that the air bubbles will remain in the area other than the accommodation space 35 between the first component member 30 and the second component member 40.

It is to be noted that the capacity of each of the accommodation spaces 35, 45, 55 is suitably adjusted depending on conditions, such as the size of the each recesses 34, 44, 54, and the pressure applied for bonding the first through fourth component members 30, 40, 50, 60. The advantageous effect of the accommodation space 35 is exemplarily described as above. The similar advantageous effect can be achieved also by the accommodation space 45 between the second component member 40 and the third component member 50 and the accommodation space 55 between the third component member 50 and the fourth component member 60.

The semiconductor device of the present embodiment can be manufactured by the similar manner to the semiconductor device of the second embodiment, but the pattern of the recesses 34, 44, 54 is modified from that of the second embodiment.

(Fourth Embodiment)

A fourth embodiment will be described hereinafter with reference to FIGS. 12A through 12D. In a manufacturing method of a semiconductor device according to the present embodiment, a step of forming a cap layer part and a step of connecting the cap layer part and the coil layer part 21 are added in the manufacturing method of the semiconductor device according to the first embodiment. Other structures and steps are similar to the first embodiment, and thus a description thereof will not be repeated. FIGS. 12A through 12D are cross-sectional views for showing a manufacturing process of the semiconductor device according to the present embodiment.

In a step shown in FIG. 12A, a support substrate 80 is prepared, and a removable layer 81 is deposited on the support substrate 80. Further, the connecting wiring portion 70 is formed on the removable layer 81.

In a step shown in FIG. 12B, a low permittivity film 71 is deposited on the removable layer 81 by a spin coating technique or the like and cured by heating. In this case, the low permittivity film 71 is deposited such that a portion of the connecting wiring portion 70 opposite to the support substrate 80 is exposed from the low permittivity film 71. In this way, a cap layer part 100 is prepared.

In a step shown in FIG. 12C, the coil layer part 21 formed in the step of FIG. 5C is prepared, and the support substrate 80 and the removable layer 81, which are adjacent to the fourth component member 60, are removed from the coil layer part 21. Then, the cap layer part 100 prepared in the step of FIG. 5B is arranged relative to the coil layer part 21 such that the connecting wiring portion 70 of the cap layer 100 is opposed to the conductive part 63 and the first connecting portion 62a of the fourth component member 60. In this condition, the coil layer part 21 and the cap layer part 100 are bonded to each other while applying pressure to connect the wiring connecting portion 70 with the conductive part 63 and the first connecting portion 62a.

In a step shown in FIG. 12D, the coil layer part 21 to which the cap layer par 100 has been bonded is placed on the circuit board 10.

In such a manufacturing method, in addition to the mask deposition technique, the connecting wiring portion 70 can be formed by a photo-etching technique by which the connecting wiring portion 70 can be more accurately formed than the mask deposition technique. Further, the advantageous effects similar to the first embodiment can be achieved.

(Other Embodiments)

The manufacturing methods of the semiconductor devices each having the coil layer part 21 including the wiring portions 32, 42, 52, 62 and the conductive parts 33, 43, 53, 63 on the surface of the circuit board 10 are exemplarily described as above. The present invention is not limited to the manufacturing methods for the semiconductor devices having the aforementioned structures.

FIGS. 13 through 16 are cross-sectional views of semiconductor devices manufactured by manufacturing methods according to other embodiments. The present invention can be adaptable to the manufacturing methods for the semiconductor devices shown in FIGS. 13 through 16.

Figure 13:
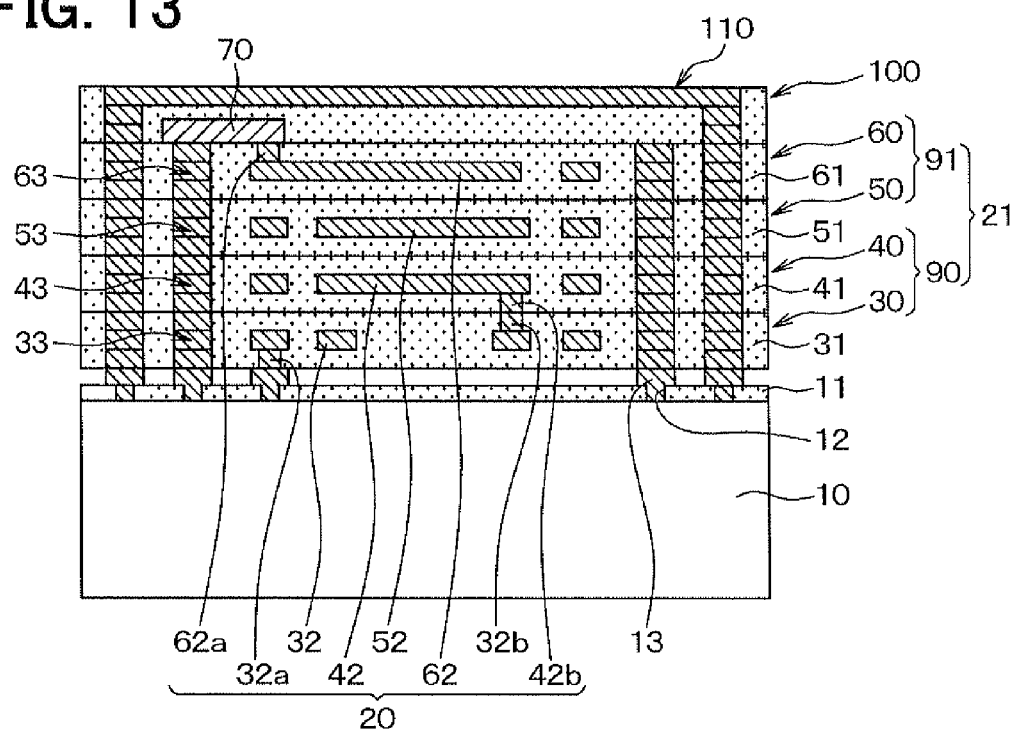
FIG. 13 is a cross-sectional view of a semiconductor device manufactured by a manufacturing method according to another embodiment of the present invention.

The semiconductor device shown in FIG. 13 has a shield layer 110 surrounding the wiring portions 32, 42, 52, 62 and the conductive parts 33, 43, 53, 63. The shield layer 110 is made of metal, such as Cu. The shield layer 110 is electrically connected to a ground wire provided in the circuit board 10 through the metal films 13.

The shield layer 110 surrounds the wiring portions 32, 42, 52, 62 and the conductive parts 33, 43, 53, 63. Therefore, external magnetic field lines can be cancelled by generating eddy currents. With this, because the coil layer part 21 serves as an antenna, emission noise entering the circuit board 10 is restricted, and malfunctions of a circuit are reduced.

In a case where the shield layer 110 is made of a material having a thermal conductivity higher than the thermal conductivity of the low-permittivity films 31, 41, 51, 61, heat generated from the coil layer part 21 can be radiated through the shield layer 110.

The semiconductor device shown in FIG. 13 is, for example, formed in the following manner.

In forming each of the first through fourth component members 30, 40, 50, 60 through the steps shown in FIGS. 4A through 4E, the wiring portion 32, 42, 52, 62 is formed as well as portions of the shield layer 110 are formed by a screen printing technique, a mask deposition or the like. In this case, the portions of the shield layer 110 are formed to surround the wiring portion 32, 42, 52, 62 and the conductive parts 33, 43, 53, 63 and pass through the respective component member 30, 40, 50, 60 in a direction perpendicular to the surface of the support substrate 80.

Further, in the steps shown in FIGS. 5A and 5C, the portions of the shield layer 110 formed in the first through fourth component members 30, 40, 50, 60 are connected to each other.

Moreover, when the cap layer part 100 is formed through the steps shown in FIGS. 12A and 12B, portions of the shield layer 110 extending in the direction perpendicular to the surface of the support substrate 80 and a portion of the shield layer 110 covering the portions of the shield layer 110, that is, a portion extending parallel to the surface of the support substrate 80 are formed. Thereafter, in the step shown in FIG. 12C, the portions of the shield layer 110 formed in the coil layer part 21 and the portions of the shield layer 110 formed in the cap layer part 100 are connected to each other. The coil layer part 21 having the cap layer part 100 is placed on the circuit board 10. Thus, the semiconductor device shown in FIG. 13 is manufactured.

Figure 14:
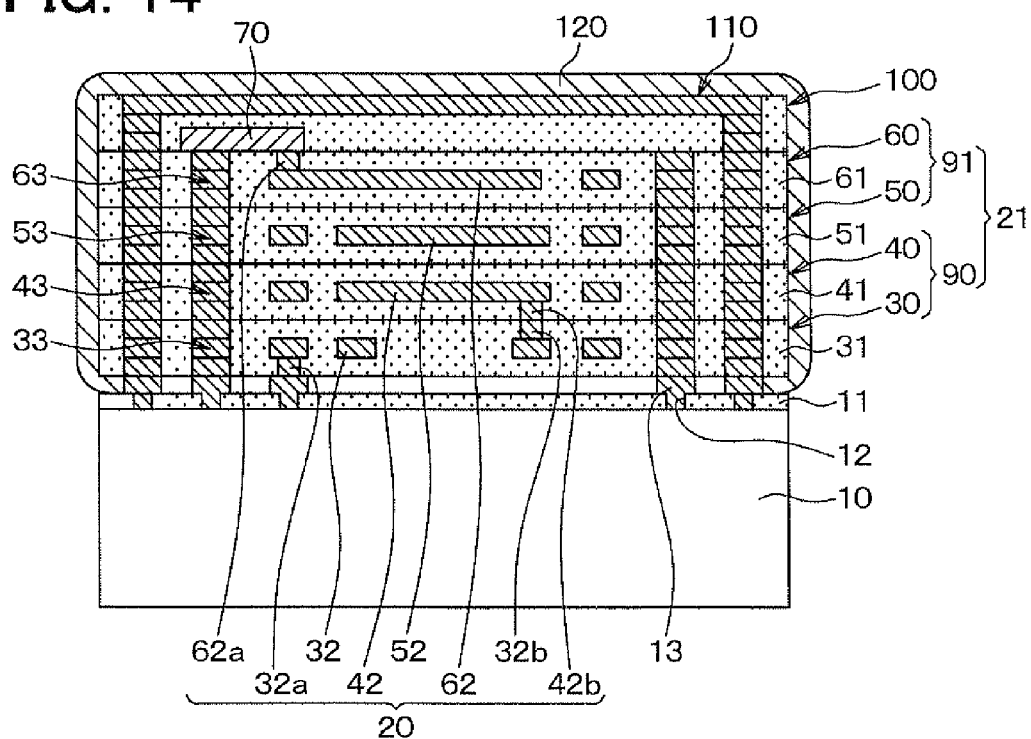
FIG. 14 is a cross-sectional view of a semiconductor device manufactured by a manufacturing method according to further another embodiment of the present invention.

The semiconductor device shown in FIG. 14 is similar to the semiconductor device shown in FIG. 13, but additionally has a protective member 120. The protective member 120 surrounds side surfaces of the coil layer part 21 and an end surface of the coil layer part 21 opposite to the circuit board 10. The protective member 120 is made of an insulating material containing a magnetic material such as ferrite.

The protective member 120 restricts magnetic fluxes generated from the coil 20 from being emitted to the outside and magnetic fluxes outside of the coil layer part 21 from entering the coil layer part 21. The semiconductor device shown in FIG. 14 is manufactured by depositing the protective member 120 on the surfaces of the coil layer part 21 by a spin coating technique or the like, relative to the semiconductor device shown in FIG. 13.

Figure 15:
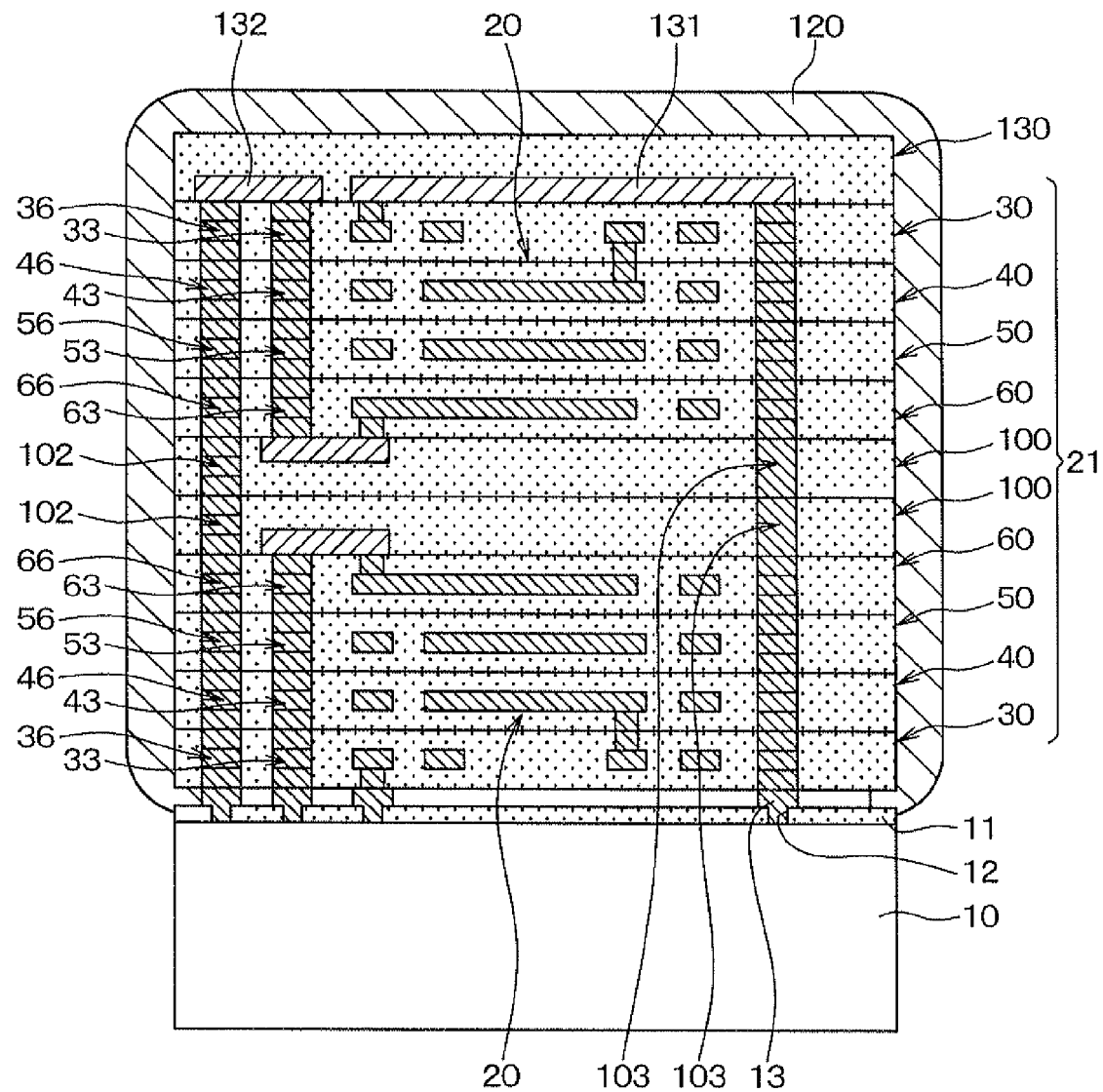
FIG. 15 is a cross-sectional view of a semiconductor device manufactured by a manufacturing method according to still another embodiment of the present invention.

The semiconductor device shown in FIG. 15 serves as a noise-cut transformer having two coils 20. The present invention is adaptable to a manufacturing method for such a semiconductor device.

The semiconductor device shown in FIG. 15 has the two coils 20. The first through fourth component members 30, 40, 50, 60 are provided with conductive parts 36, 46, 56, 66. The cap layer parts 100 are provided with conductive parts 102. The conductive parts 36, 46, 56, 66, 102 are provided for electrically connecting one of the coils 20, which is located further from the circuit board 10 than the other coil 20, with the circuit board 10.

The cap layer parts 100 are further provided with conductive parts 103 for electrically connecting the conductive parts 63 of the two coils 20. A connecting layer 130 is bonded to one of the first component members 30, which is located further from the circuit board 10 than the other first component member 30. The connecting layer 130 includes a connecting wiring portion 131 and a connecting wiring portion 132.

The connecting wiring portion 131 connects the first connecting portion 32a and the wiring portion 32. The connecting wiring portion 132 electrically connects the conductive part 33 and the conductive part 36. The coil layer part 21 is covered with the protective member 120, similar to the semiconductor device shown in FIG. 14.

The semiconductor device shown in FIG. 15 is manufactured in the following manner.

First, two coil layer parts 21 shown in FIG. 12C are prepared. The support substrate 80 and the removable layer 81, which are adjacent to the cap layer part 100, are removed from each of the coil layer parts 21. Each of the cap layer parts 100 is prepared such that the portion of the connecting wiring portion 70 opposite to the fourth component member 60 is covered by the low-permittivity film 71. Also, in the first through fourth component members 30, 40, 50, 60, the conductive parts 36, 46, 56, 66 are formed. In the cap layer parts 100, the conductive parts 102 are formed.

Each of the cap layer parts 100 is arranged relative to the corresponding coil layer part 21. Then, the coil layer part 21 and the cap layer part 100 are bonded to each other while applying pressure. Thereafter, one of the support substrates 80 and one of the removable layers 81 are removed, and the connecting layer 130 is deposited on the surface from which the support substrate 80 and the removable layer 81 have been removed.

The first connecting portion 32a and the wiring portion 32 are connected to each other through the connecting wiring portion 131. The conductive part 33 and the conductive part 36 are connected to each other through the connecting wiring portion 132. Thereafter, the coil layer part 21 is placed on the circuit board 10, and the protective member 120 is deposited to surround the coil layer part 21. In this way, the semiconductor device shown in FIG. 15 is manufactured.

The semiconductor device shown in FIG. 15 may employ the shield layer 110, similar to the semiconductor device shown in FIG. 14.

Figure 16:
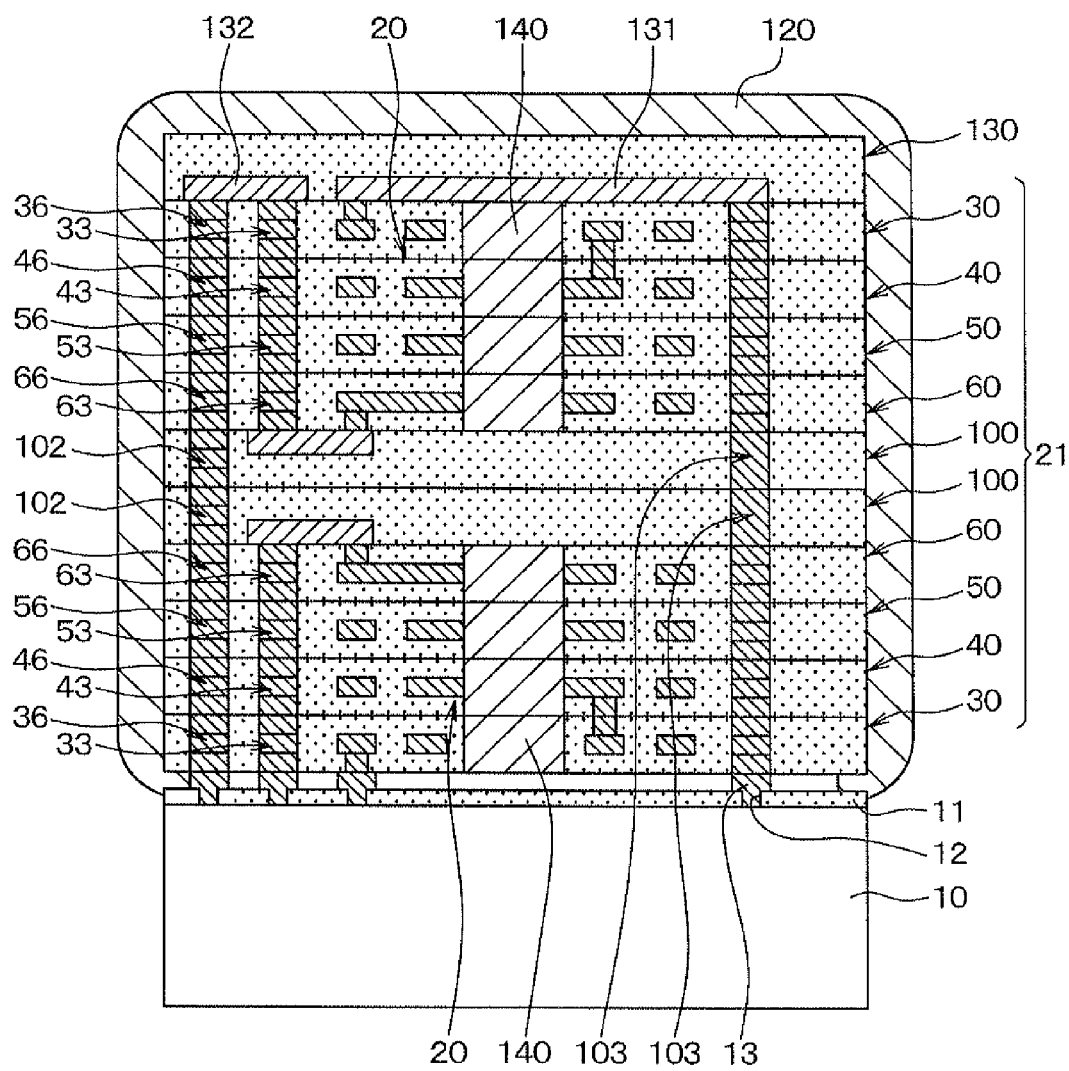
FIG. 16 is a cross-sectional view of a semiconductor device manufactured by a manufacturing method according to yet another embodiment of the present invention.

The semiconductor device shown in FIG. 16 additionally has magnetic members 140 extending in the layering direction of the first through fourth component members 30, 40, 50, 60 inside of the coils 20, relative to the semiconductor device shown in FIG. 15. The magnetic members 140 are arranged in the same direction as the magnetic field lines generated inside of the coils 20. Thus, the magnetic field lines can effectively pass through the magnetic members 140. As such, an inductance of the coils 20 can improve, as compared with the semiconductor device without having the magnetic members 140 inside of the coils 20.

The semiconductor device shown in FIG. 16 is, for example, manufactured in the following manner.

When each of the first through fourth component members 30, 40, 50, 60 is formed through the steps shown in FIGS. 4A through 4E, the wiring portion 32, 42, 52, 62 is formed as well as a portion of the magnetic member 140 is formed. In the steps shown in FIGS. 5A and 5C, the portions of the magnetic member 140 formed in the first through fourth component members 30, 40, 50, 60 are connected to each other. Thus, the magnetic member 140 is formed inside of the coil 20.

Figure 17:
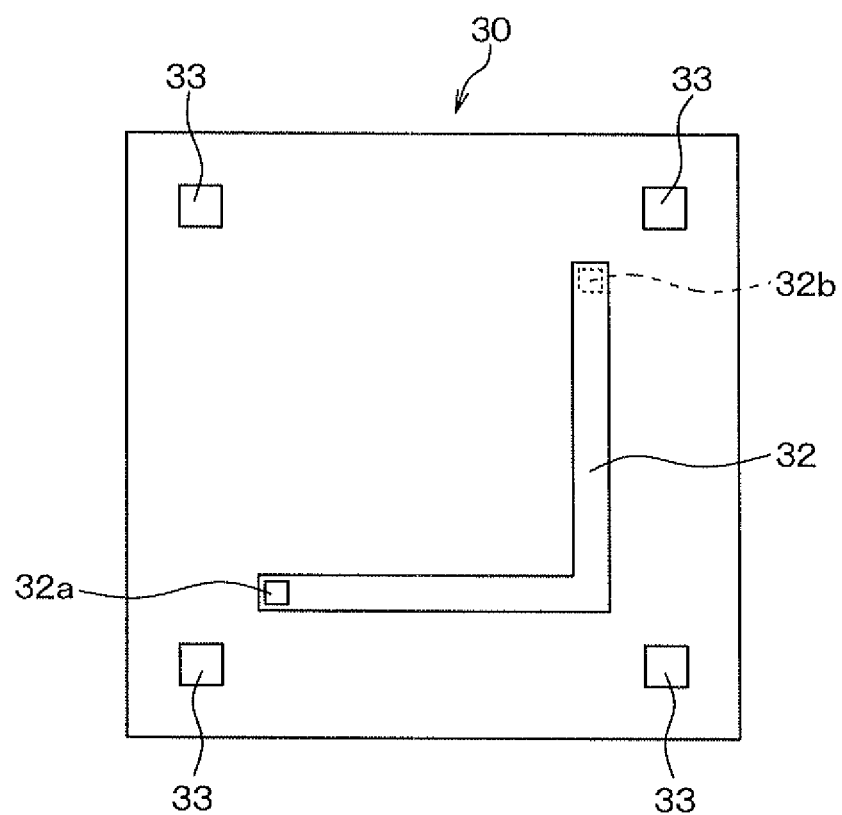
FIG. 17 is a schematic plan view of a component member of a coil layer part of a semiconductor device according to still more another embodiment of the present invention.

In the above embodiments, the wiring portion 32, 42, 52, 62 of each component member 30, 40, 50, 60 has the spiral shape wound from the inner position toward the outer position. However, the shape of the wiring portion 32, 42, 52, 62 is not limited to the spiral shape. FIG. 17 is a plan view of a first component member 30 of a semiconductor device according to another embodiment. In such a case, the second through fourth component members 40, 50, 60 have the same shape as the first component member 30 shown in FIG. 17.

As shown in FIG. 17, the wiring portion 32 has an L shape. The wiring portion 42, 52, 62 of each of the second through fourth component members 40, 50, 60 has an L shape, similar to the wiring portion 32 of the first component member 30. The first through fourth component members 30, 40, 50, 60 are bonded to each other such that the wiring portions between adjacent two component members form a loop shape.

In such a case, the wiring portions are not opposed to each other in an area other than the connecting portions between the adjacent two component members. Therefore, a parasitic capacitance between the adjacent wiring portions can be reduced, and hence a Q-value can improve.

Each of the wiring portions 32, 42, 52, 62 may have any other shapes, such as a semi-circular shape or a V shape.

In some the above embodiments, the coil layer part 21 is constructed of the four component members 30, 40, 50, 60. However, the number of the component members in the coil layer part 21 is not limited to four.

For example, the coil layer part 21 can be constructed of six component members. In such a case, for example, the first layered body 90 shown in FIG. 5B and the coil layer part 21 shown in FIG. 5D are prepared, and then bonded to each other. Thus, the coil layer part 21 having the six component members can be formed.

As another example, the first layered body 90 shown in FIG. 5B and the body shown in FIG. 4D are prepared and bonded to each other. Thus, the coil layer part 21 having three component members can be formed.

As further another example, the coil layer part 21 having eight component members can be formed by bonding two layered bodies shown in FIG. 5D to each other. As still another example, the coil layer part 21 having sixteen component members can be formed by preparing and bonding two layered bodies each having eight component members to each other.

In the semiconductor device of each of the above embodiments, the first through fourth conductive members 30, 40, 50, 60 can be provided with heat-transfer members made of a material having heat conductivity higher than that of the low-permittivity films 31, 41, 51, 61. The heat-transfer members can be formed on an outer area of the wiring portions 32, 42, 52, 62 when the first through fourth component members 30, 40, 50, 60 are formed. In such a semiconductor device, heat generated in the coil layer part 21 can be readily radiated to the outside of the coil layer part 21 through the heat-transfer members.

The removable layers 81 disposed between the first through fourth component members 30, 40, 50, 60 and the support substrates 80 can be made of ultraviolet curable resins that are cured by ultraviolet lights having different wavelengths. In such a case, when one of the removable layers 81 is cured, for example, in the step shown in FIG. 5B, it is less likely that the other removable layer 81 will be cured.

In the above embodiments, if an insulation film is employed as the removable layer 81, the support substrate 80 can be removed by etching, polishing or the like.

In the above embodiments, to form the first component member 30, the wiring portion 32 and the conductive portions 33b are formed, and then the second connecting portion 32b and the conductive portion 33c are formed above the wiring portion 32 and the conductive portion 33b, respectively. Thereafter, the low-permittivity film 31 is deposited such that the second connecting portion 32b and the conductive portions 33c expose from the low-permittivity film 31. The second through fourth component members 40, 50, 60 are, respectively, formed in the similar manner. Alternatively, the component members 30, 40, 50, 60 can be formed in the following manner.

For example, after the step shown in FIG. 4C, the low-permittivity film 31 is deposited such that the part of the wiring portion 32 and the part of the conductive portion 33b, which are opposite to the support substrate 80, expose from the low-permittivity film 31, and then an insulation film is laid on the low-permittivity film 31. Thereafter, contact holes are formed in the insulation film at locations where the conductive portions 33c and the second connecting portion 32b are to be formed. The conductive portions 33c and the second connecting portion 32b are formed in the contact holes by a screen printing technique, a mask deposition, or the like. In this way, the first component member 30 can be formed.

In such a case, the insulation film may be harder than the low-permittivity film 31. Thus, even in a case where the recess 34, 44 are formed as the second and third embodiments, it is less likely that the recesses 34 will be deformed when the first component member 30 and the second component member 40 are bonded to each other. As such, size variations of the accommodation spaces 35 between the products can be reduced.

The description has been made with regard to the first component member 30 as an example. The above-described structures can be similarly employed in the second and third component members 40, 50. The recess 44 can be formed in the second component member 40 after the first layered body 90 is formed. In such a case, for example, an insulation film harder than the low-permittivity film 41 is deposited on the first surface of the second component member 40 opposite to the first component member 30. Then, contact holes are formed in the insulation film to expose the first connecting portion 42a and the conductive part 43. Also, the recess 44 is formed in the insulation film. Thereafter, a metal paste is embedded in the contact holes. Accordingly, the second component member 40 having the surface made of the insulation film is formed.

In the second embodiment, the recesses 34 are formed on the second surface of the first component member 30 facing the second component member 40. The recesses 44 are formed on the first surface of the second component member 40 facing the third component member 50. The recesses 54 are formed on the second surface of the third component member 50 facing the fourth component member 60.

Alternatively, the recesses can be formed on the second surface of the second component member 40 facing the first component member 30, the first surface of the third component member 50 facing the second component member 40, and the second surface of the fourth component member 60 facing the third component member 50. That is, the recesses can be formed in either one of the adjacent two component members as long as the accommodation spaces are formed between the adjacent component members.

As another example, the recesses can be formed in both the adjacent component members. For example, the recess 34 is formed on the second surface of the first component member 30 facing the second component member 40, and a recess is formed on the second surface of the second component member 40 facing the first component member 30. Also in such a case, the recesses can be formed between the second component member 40 and the third component member 50 and between the third component member 50 and the fourth component member 60 in the similar manner.

The semiconductor device can be formed by combining the second embodiment and the third embodiment. For example, the multiple recesses 34 are formed in the similar manner to the second embodiment, but the single recess 44 and the single recess 54 are formed in the similar manner to the third embodiment.

In the second and third embodiments, each of the recesses 34, 44, 54 can be formed in an area outside of the first area opposing to the respective wiring portion 32, 42, 52. Even if the recesses 34, 44, 54 are formed in the areas outside of the first areas opposing to the wiring portions 32, 42, 52, the existence of the air bubbles in the areas other than the accommodation spaces between the first through fourth component members 30, 40, 50, 60 is reduced, as compared with the case without having the recesses 34, 44, 54, 64.

Further, the semiconductor device can be formed by combining the fourth embodiment with one of or both of the second embodiment and the third embodiment. For example, the semiconductor device according to the second embodiment can have the cap layer part 100. Also, the semiconductor device according to the third embodiment can have the cap layer part 100. Namely, the present invention can be implemented by combining the above embodiments in various other ways.

Additional advantages and modifications will readily occur to those skilled in the art. The invention in its broader term is therefore not limited to the specific details, representative apparatus, and illustrative examples shown and described.

What is claimed is:

1. A semiconductor device, comprising:
   a board having a surface; and
   a coil layer part disposed on the surface of the board, the coil layer part constructed of a plurality of component members and including a coil defining an axis in a direction of a normal to the surface of the board, wherein
   each of the component members includes a wiring portion having a predetermined pattern and an insulation film surrounding the wiring portion,
   each wiring portion is provided with a connecting portion exposing from the respective insulation film,
   the coil is constructed of the wiring portions connected to each other through the connecting portions,
   the coil layer part is formed by bonding the component members disposed on surfaces of support substrates to each other such that the wiring portions are connected to each other through the connecting portions while maintaining the surfaces of the support substrates parallel to each other,
   the coil layer part has an accommodation space between adjacent component members, and
   the accommodation space is provided by a recess defined in a surface portion of the insulation film of at least one of the adjacent component members.

2. The semiconductor device according to claim 1, wherein the recess is located in an area opposing to the wiring portion other than a portion from which the connecting portion exposes.

3. The semiconductor device according to claim 1, wherein the recess is located in an area corresponding to an inside of the coil.

4. The semiconductor device according to claim 1 wherein the recess has a continuous shape having an opening at an outer end of the component member, the opening allowing communication between the accommodation space and an outside of the coil layer part.

* * * * *